United States Patent
Leng et al.

(10) Patent No.: US 11,735,516 B2
(45) Date of Patent: Aug. 22, 2023

(54) METAL-OXIDE-METAL (MOM) CAPACITORS FOR INTEGRATED CIRCUIT MONITORING

(71) Applicant: Microchip Technology Incorporated, Chandler, AZ (US)

(72) Inventors: Yaojian Leng, Vancouver, WA (US); Justin Sato, West Linn, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 96 days.

(21) Appl. No.: 17/306,019

(22) Filed: May 3, 2021

(65) Prior Publication Data

US 2022/0130753 A1    Apr. 28, 2022

Related U.S. Application Data

(60) Provisional application No. 63/105,169, filed on Oct. 23, 2020.

(51) Int. Cl.
*H01L 23/522* (2006.01)
*H01L 21/66* (2006.01)
(Continued)

(52) U.S. Cl.
CPC .... *H01L 23/5223* (2013.01); *H01L 21/67259* (2013.01); *H01L 22/20* (2013.01);
(Continued)

(58) Field of Classification Search
CPC ............. H01L 23/5223; H01L 23/5226; H01L 23/5283; H01L 21/67259; H01L 22/20; H01L 22/34; H01L 28/40
(Continued)

(56) References Cited

U.S. PATENT DOCUMENTS

| | | | |
|---|---|---|---|
| 2012/0018843 A1* | 1/2012 | Fong | H01L 28/60 257/532 |
| 2015/0115986 A1 | 4/2015 | Wang et al. | 324/750.3 |

(Continued)

OTHER PUBLICATIONS

Omran, Hesham et al., "Matching Properties of Femtofarad and Sub-Femtofarad MOM Capacitors," IEEE Transactions on Circuits and Systems—I: Regular Papers, vol. 63, No. 6, pp. 763-772, Jun. 1, 2016.

(Continued)

*Primary Examiner* — Tu-Tu V Ho
(74) *Attorney, Agent, or Firm* — Slayden Grubert Beard PLLC

(57) ABSTRACT

An array of metal-oxide-metal (MOM) capacitors formed in an integrated circuit (IC) structure may be used for evaluating misalignments between patterned layers of the IC structure. The array of MOM capacitors may be formed in a selected set of patterned layers, e.g., a via layer formed between a pair of metal interconnect layers. The MOM capacitors may be programmed with different patterned layer alignments (e.g., built in to photomasks or reticles used to form the patterned layers) to define an array of different alignments. When the MOM capacitors are formed on the wafer, the actual patterned layer alignments capacitors may differ from the programmed layer alignments due a process-related misalignment. The MOM capacitors may be subjected to electrical testing to identify this process-related misalignment, which may be used for initiating a correcting action, e.g., adjusting a manufacturing process or discarding misaligned IC structures or devices.

14 Claims, 14 Drawing Sheets

(51) Int. Cl.
  *H01L 23/528* (2006.01)
  *H01L 49/02* (2006.01)
  *H01L 21/67* (2006.01)

(52) U.S. Cl.
  CPC .......... *H01L 22/34* (2013.01); *H01L 23/5226* (2013.01); *H01L 23/5283* (2013.01); *H01L 28/40* (2013.01)

(58) Field of Classification Search
  USPC .......................................................... 438/11
  See application file for complete search history.

(56) References Cited

U.S. PATENT DOCUMENTS

| | | |
|---|---|---|
| 2018/0294330 A1 | 10/2018 | Cui et al. |
| 2018/0315548 A1 | 11/2018 | Wang et al. |
| 2019/0305077 A1 | 10/2019 | Feng et al. |

OTHER PUBLICATIONS

International Search Report and Written Opinion, Application No. PCT/US2021/032721, 12 pages, dated Oct. 19, 2021.

* cited by examiner

5x5 2D ARRAY OF 25 MOM CAPACITORS WITH 25 DIFFERENT PROGRAMMED LAYER ALIGNMENTS (e.g., ALIGNMENT OFFSETS BUILT INTO RETICLE) (X, Y IN nm)

| | | | | |
|---|---|---|---|---|
| • MOM 600$_1$<br>• PLA: -20,+20<br>• ALA: -30,+30<br>• $V_{breakdown}$ = 15 | • MOM 600$_2$<br>• PLA: -10,+20<br>• ALA: -20,+30<br>• $V_{breakdown}$ = 19 | • MOM 600$_3$<br>• PLA: 0,+20<br>• ALA: -10,+30<br>• $V_{breakdown}$ = 22 | • MOM 600$_4$<br>• PLA: +10,+20<br>• ALA: 0,+30<br>• $V_{breakdown}$ = 25 | • MOM 600$_5$<br>• PLA: +20,+20<br>• ALA: +10,+30<br>• $V_{breakdown}$ = 22 |
| • MOM 600$_6$<br>• PLA: -20,+10<br>• ALA: -30,+20<br>• $V_{breakdown}$ = 21 | • MOM 600$_7$<br>• PLA: -10,+10<br>• ALA: -20,+20<br>• $V_{breakdown}$ = 29<br>• (FIGS. 9A-9B) | • MOM 600$_8$<br>• PLA: 0,+10<br>• ALA: -10,+20<br>• $V_{breakdown}$ = 32 | • MOM 600$_9$<br>• PLA: +10,+10<br>• ALA: 0,+20<br>• $V_{breakdown}$ = 35<br>• (FIGS. 8A-8B) | • MOM 600$_{10}$<br>• PLA: +20,+10<br>• ALA: +10,+20<br>• $V_{breakdown}$ = 32 |
| • MOM 600$_{11}$<br>• PLA: -20,0<br>• ALA: -30,+10<br>• $V_{breakdown}$ = 25 | • MOM 600$_{12}$<br>• PLA: -10,0<br>• ALA: -20,+10<br>• $V_{breakdown}$ = 35 | • MOM 600$_{13}$<br>• PLA: 0,0<br>• ALA: -10,+10<br>• $V_{breakdown}$ = 41 | • MOM 600$_{14}$<br>• PLA: +10,0<br>• ALA: 0,+10<br>• $V_{breakdown}$ = 43 | • MOM 600$_{15}$<br>• PLA: +20,0<br>• ALA: +10,+10<br>• $V_{breakdown}$ = 41 |
| • MOM 600$_{16}$<br>• PLA: -20,-10<br>• ALA: -30,0<br>• $V_{breakdown}$ = 28 | • MOM 600$_{17}$<br>• PLA: -10,-10<br>• ALA: -20,0<br>• $V_{breakdown}$ = 38<br>• (FIGS. 7A-7B) | • MOM 600$_{18}$<br>• PLA: 0,-10<br>• ALA: -10,0<br>• $V_{breakdown}$ = 45 | • MOM 600$_{19}$<br>• PLA: +10,-10<br>• ALA: 0,0<br>• $V_{breakdown}$ = 50<br>• (FIGS. 6A-6B) | • MOM 600$_{20}$<br>• PLA: +20,-10<br>• ALA: +10,0<br>• $V_{breakdown}$ = 45 |
| • MOM 600$_{21}$<br>• PLA: -20,-20<br>• ALA: -30,-10<br>• $V_{breakdown}$ = 25 | • MOM 600$_{22}$<br>• PLA: -10,-20<br>• ALA: -20,-10<br>• $V_{breakdown}$ = 35 | • MOM 600$_{23}$<br>• PLA: 0,-20<br>• ALA: -10,-10<br>• $V_{breakdown}$ = 41 | • MOM 600$_{24}$<br>• PLA: +10,-20<br>• ALA: 0,-10<br>• $V_{breakdown}$ = 43 | • MOM 600$_{25}$<br>• PLA: +20,-20<br>• ALA: +10,-10<br>• $V_{breakdown}$ = 41 |

LEGEND
- MOM CAPACITOR NUMBER
- PROGRAMMED VIA LAYER ALIGNMENT (X,Y IN nm)
- ACTUAL VIA LAYER ALIGNMENT ON WAFER (X,Y IN nm)
- MEASURED $V_{breakdown}$
- FIGURES SHOWING AN EXAMPLE MOM CAPACITOR WITH THE RESPECTIVE ACTUAL ALIGNMENT (ALA)

PROCESS RELATED LAYER MISALIGNMENT (-10,+10)

METAL-OXIDE-METAL (MOM) CAPACITORS FOR INTEGRATED CIRCUIT MONITORING

RELATED APPLICATION

This application claims priority to commonly owned U.S. Provisional Patent Application No. 63/105,169 filed Oct. 23, 2020, the entire contents of which are hereby incorporated by reference for all purposes.

TECHNICAL FIELD

The present disclosure relates to integrated circuit (IC) fabrication, and more particularly, to using metal-oxide-metal (MOM) capacitors to evaluate or monitor IC structures and processes, e.g., interconnect structures and processes.

BACKGROUND

Integrated circuits (ICs) typically include various IC elements (e.g., transistors, capacitors, resistors, etc.) connected to each other or to other electrical devices by metal wiring, referred to as "interconnect," for example aluminum, copper, or cobalt interconnect. As IC devices continues to shrink, the level of interconnect metal layers grows, such that the interconnect quality may substantially affect the yield and reliability of manufactured IC devices. Thus, interconnect fabrication has become particularly important in the industry. However, existing system and techniques for monitoring an interconnect fabrication process ("interconnect process") are substantially deficient. For example, existing means for monitoring via-to-metal misalignment, monitoring low-k value for Cu interconnect, monitoring High Density Plasma (HDP) voids between metal lines for Al interconnect, or monitoring metal corrosion (Al or Cu), to the extent they exist, are inadequate and ineffective. Thus, there is need for an effective systems and methods for monitoring interconnect process quality, for example for both aluminum and copper interconnect formation.

FIGS. 1-3 show three conventional structures for monitoring interconnect fabrication quality. FIG. 1 shows a top view of a conventional monitoring arrangement 100 including metal comb structures 102 and 104 arranged in an interleaved but separated manner. The monitoring arrangement 100 may be tested by measuring a conductance or resistance between the two comb structures 102 and 104. Detection of a reduced electrical resistance (e.g., below a defined threshold resistance value) between the metal comb structures 102 and 104 may indicate a short circuit between the metal comb structures 102 and 104, which may result from an inaccurate or defective process, such as an insufficient metal etch process that leaves stringers between metal lines, thereby causing a short circuit. An example short circuit is indicated at 106.

Other conventional monitoring arrangements are configured to monitor interconnect quality by detecting an open circuit. For example, FIG. 2 shows a top view of a long, serpentine metal structure 200 used to detect an opening in the metal lines, e.g., by measuring a resistance through the serpentine metal structure 200. Detection of a high electrical resistance (e.g., above a defined threshold resistance value) may indicate an open circuit caused by a break in the serpentine metal structure 200, e.g., as indicated at 202.

FIG. 3 shows a side cross-sectional view of a conventional monitoring arrangement 300 including interconnect elements 302 formed in multiple metal lines 304a, 304b (two shown, without limitation) and connected by vias 306, to define a chain-like structure 310. This structure may be used to detect the quality of vias 306. For example, an electrical resistance through the chain-like structure 310 may be measured and compared to an expected resistance, e.g., based on the number of vias 306 in the chain-like structure 310. Detection of a high resistance (e.g., above an upper threshold resistance value) may indicate an open via, while detection of a lower resistance (e.g., below a lower threshold resistance value) may indicate a short circuit in the chain-like structure 310.

However, the conventional monitoring structures and techniques are generally simplistic and inadequate for monitoring various parameters of interconnect process quality. For example, the conventional monitoring structures and techniques discussed above cannot effectively detect misalignments between different interconnect layers (e.g., metal layers and/or via layers), for example resulting from a photo misalignment (i.e., a photolithography process variation or margin) of a particular interconnect layer relative to an adjacent interconnect layer. As another example, the conventional monitoring structures cannot effectively detect damage to low-k dielectric materials, e.g., caused by a plasma etch or ash process. As yet another example, the conventional monitoring structures cannot effectively detect voids in a fill region (e.g., dielectric region between interconnect structures in an IC device) which may cause yield loss and reliability failure. There is a need for improved structures and methods for detecting or monitoring interconnect process quality.

SUMMARY

Embodiments of the present invention provide structures and methods for forming and using metal-oxide-metal (MOM) capacitors to monitor integrated circuit structures and/or manufacturing processes, for example the alignment of interconnect structures, the presence of low-k process damage, and/or other interconnect quality parameters.

When a multi-layered IC device is formed, the programmed (designed) alignment between different patterned layers in the IC device (e.g., interconnect layers), referred to herein as the "programmed layer alignment," may differ from the actual alignment of the patterned layers formed on the wafer, referred to herein as the "actual layer alignment," due to process variations, inaccuracies, defects, or other causes. This difference between the programmed layer alignment and the actual layer alignment on the wafer is referred to herein as a "process-related layer misalignment." For example, a process-related layer misalignment between a via layer and a metal layer (or multiple metal layers) may result in via/metal misalignment in the IC device, which may negatively affect the performance of the IC device.

Thus, some embodiments of the present disclosure provide a method of detecting, analyzing, and correcting a process-related layer misalignment in an IC device structure, using one or more MOM capacitors. In some embodiments, a process-related layer misalignment between selected patterned layers may be detected and analyzed (e.g., to determine the direction and magnitude of the misalignment) using an array of MOM capacitors formed in the selected patterned layers. Each MOM capacitor in the array may be designed with a different programmed layer alignment between the selected patterned layers. For example, the array of MOM capacitors may include:

(a) a MOM capacitor having a programmed layer alignment set to a predefined target alignment, and (b) multiple MOM capacitors having various programmed layer alignments offset (misaligned) from the target alignment, e.g., providing via/metal misalignments with different directions and/or magnitudes of offset (misalignment) from the target alignment.

As used herein, a "target alignment" may refer to an alignment specified in a device design specification, for example a via/metal alignment in which each via is accurately aligned with overlying and underlying metal interconnect structures, for example as shown in FIG. 5A and FIGS. 6A-6B.

When the array of MOM capacitors is formed on the wafer, a process-related layer misalignment may affect the array of MOM capacitors, such that the actual layer alignment of each MOM capacitor on the wafer differs from its programmed layer alignment. As a result of the process-related layer misalignment, the actual layer alignment of each MOM capacitor may be closer to, or further from, the target alignment as compared with the programmed layer alignment for that MOM capacitor. For example, for a particular MOM capacitor having a programmed layer alignment offset from the target alignment in a +x direction, a process-related layer misalignment in the −x direction may provide an actual layer alignment closer to the target alignment than the programmed layer alignment for that particular MOM capacitor.

Each MOM capacitor in the array may be electrically tested to identify the MOM capacitor having an actual alignment closest to the target alignment. For example, a breakdown voltage may be determined for each MOM capacitor in the array, wherein the breakdown voltage increases as the actual layer alignment and the target alignment come into alignment, and decreases as the actual layer alignment and the target alignment become further misaligned. Thus, the MOM capacitor in the array having the highest breakdown voltage may be identified, indicating the best alignment to the target alignment.

The programmed layer alignment of this best-aligned MOM capacitor may then be used to determine and implement a corrective action, for example (a) discarding IC structures or devices having a misalignment or misalignment-related performance beyond defined threshold limits, (b) adjusting at least one aspect of the fabrication process to reduce the process-related layer misalignment (e.g., adjusting a photolithography process or process step), or (c) any other type of corrective action.

In other embodiments, a MOM capacitor may be used to monitor damage present in low-k dielectric material in an IC device. In advanced CMOS (complementary metal-oxide-semiconductor) technology, low-k dielectric materials (e.g., as organosilicate glass and its porous form) are often used to reduce RC delay (i.e., the delay in signal speed through circuit wiring due to resistance and capacitance) associated with interconnect structures in the device. Carbon and porosity are often introduced in the low-k dielectric materials to lower the dielectric constant. However, the low-k dielectric materials may be subject to plasma-induced damage during the fabrication process, e.g., during plasma etching, particularly resist ashing. For example, the low-k material, which is hydrophobic due to large concentrations of methyl group elements, becomes hydrophilic when exposed to an oxygen-containing plasma, where methyl (—CH3) is replaced by hydroxyl (—OH). As another example, low-k materials may crack from mechanical stress (e.g., during a Chemical Mechanical Polishing (CMP) process) or thermal stress. Damaged low-k materials may have significantly higher dielectric constant (k) values, which may be detrimental to circuit performance.

Thus, some embodiments include forming a MOM capacitor with a low-k dielectric, e.g., organosilicate glass and its porous form, between elongated metal fingers (e.g., instead of oxide used in a conventional MOM capacitor), which can be used to monitor the dielectric constant of the low-k material over time, e.g., by measuring the breakdown voltage of the MOM capacitor over time.

Other embodiments provide a method of detecting voids in a region of dielectric material formed between metal interconnect structures in an integrated circuit (IC) device. A plurality of MOM capacitors may be formed, each including metal fingers separated by dielectric regions. The capacitance of each MOM capacitor may be measured, and compared with each other and/or with reference data, and the presence of dielectric region voids in each MOM capacitor (which may represent the presence of dielectric region voids at other areas on the wafer) may be evaluated based on such comparisons.

Still other embodiments provide methods for monitoring metal corrosion in an IC structure. A MOM capacitor may be formed with elongated metal fingers structures, e.g., formed from aluminum or copper, and a capacitance value and/or breakdown voltage of the MOM capacitor may be monitored over time. A change in the measured electrical parameter(s) over time may be determined, which may indicate the existence of metal corrosion based in the IC structure.

One aspect provides a method of evaluating an integrated circuit structure. The method includes forming a plurality of MOM capacitors in a plurality of patterned layers of the integrated circuit structure, each capacitor being formed with a different alignment between the patterned layers in at least one direction; performing electrical testing of the plurality of capacitors; and determining a patterned layer misalignment in the plurality of patterned layers based on the electrical testing.

In one embodiment, forming a plurality of capacitors comprises forming a plurality of MOM capacitors.

In one embodiment, determining a patterned layer misalignment comprises determining a process-related misalignment associated with forming the plurality of patterned layers.

In one embodiment, determining a patterned layer misalignment comprises determining the process-related misalignment in two orthogonal directions.

In one embodiment, the plurality of capacitors are formed with different programmed layer alignments relative to the target alignment in two orthogonal directions.

In one embodiment, the method also includes initiating a corrective action in response to the determined patterned layer misalignment. For example, the corrective action may include discarding IC structures or devices fabricated using the misaligned process. As another example, a process or process step for forming at least one of the patterned layers may be adjusted based on the determined patterned layer misalignment.

In one embodiment, forming the plurality of capacitors in the plurality of patterned layers of the integrated circuit structure includes (a) forming a first metal layer and a second metal layer, each of the first and second metal layers including comb-like components including a plurality of elongated metal fingers, and (b) forming a via layer between the first and second metal layers, the via layer including at least one via connecting at least one elongated metal finger formed in the first metal layer with at least one elongated metal finger formed in the second metal layer.

In one embodiment, performing electrical testing on the plurality of capacitors includes determining a breakdown voltage of each capacitor and identifying a capacitor of the plurality of capacitors having a highest breakdown voltage.

In one embodiment, determining a patterned layer misalignment based on the electrical testing includes identifying a best-aligned capacitor from the plurality of capacitors based on the electrical testing of the plurality of capacitors, and determining the patterned layer misalignment based on the identified best-aligned capacitor.

In one embodiment, the step of forming the plurality of capacitors may include defining a different programmed layer alignment relative to a target alignment for each of the plurality of capacitors, and forming the plurality of capacitors, each capacitor having an actual layer alignment that differs from the programmed layer alignment for that capacitor due to a process-related misalignment associated with forming the plurality of patterned layers. Further, the step of determining a patterned layer misalignment in the plurality of patterned layers based on the electrical testing may include using the electrical testing of the plurality of capacitors to identify a capacitor of the plurality of capacitors having an actual layer alignment closest to the target alignment, and determining at least one of a direction and a magnitude of the process-related misalignment based on the programmed layer alignment of the identified capacitor having the actual layer alignment closest to the target alignment.

In one embodiment, the method further includes adjusting a process for forming at least one of the patterned layers of the integrated circuit fabrication process based on the determined at least one of the direction and the magnitude of the process-related misalignment.

Another aspect provides a method of evaluating damage to low-k dielectric material in an integrated circuit (IC) structure. The method may include forming a MOM capacitor including a plurality of elongated metal fingers separated by a low-k dielectric material; performing electrical testing of the MOM capacitor; and determining a low-k damage condition based on the electrical testing.

In some embodiments, the low-k dielectric material comprises organosilicate glass and its porous form.

In one embodiment, the method further includes initiating a corrective action based on the determined low-k damage condition.

In one embodiment, performing electrical testing of the MOM capacitor comprises measuring a breakdown voltage of the MOM capacitor, and evaluating the measured breakdown voltage.

Another aspect provides a method of detecting voids in dielectric regions of integrated circuit (IC) structures. The method may include forming a plurality of MOM capacitors including metal structures separated by dielectric regions; measuring a capacitance of each of the plurality of MOM capacitors; analyzing the measured capacitances of the plurality of MOM capacitors; and identifying the existence of voids in the dielectric regions of at least one of the plurality of MOM capacitors based on the analyzed capacitances. In some embodiments, analyzing the measured capacitances of the plurality of MOM capacitors comprises analyzing a distribution of the measured capacitances, comparing with the distribution of capacitances with a normal or Gaussian distribution, and identifying MOM capacitors having an outlier capacitance, which may indicate the existence of dielectric region voids in the identified outlier MOM capacitors.

Still another aspect provides a method of monitoring metal corrosion in an integrated circuit (IC) structure. The method may include forming a MOM capacitor including metal structures; measuring at least one electrical parameter of the MOM capacitor over time; identifying a change in the at least one measured electrical parameter over time; and identifying metal corrosion in the IC structure based on the identified change in the at least one measured electrical parameter over time. In some embodiments, the method may include monitoring a capacitance value and breakdown voltage of the MOM capacitor over time, identifying a change in the capacitance value and/or breakdown voltage (e.g., a change exceeding a threshold value), and identifying metal corrosion in the IC structure based on the identified change in the capacitance value and/or breakdown voltage of the MOM capacitor.

In one embodiment, measuring an electrical parameter of the MOM capacitor over time comprises measuring a capacitance of the MOM capacitor over time.

In one embodiment, forming the MOM capacitor includes forming copper structures including elongated copper fingers spaced apart by a dielectric region, and depositing a dielectric barrier layer on the elongated copper fingers. The interface between the coppers structure and dielectric barrier may be important for the reliability of copper interconnect. The quality of this interface can become degraded, e.g., by residue from a copper CMP process, by the formation of voids resulting from a copper barrier layer (e.g., Ta/TaN layer) and/or copper seed layer deposition, by the formation voids during a copper plating process, and/or by the formation of hillocks during deposition of the dielectric barrier layer. The quality of the copper/dielectric barrier layer interface may be monitored by monitoring the breakdown voltage of the capacitor.

Still another aspect provides a MOM capacitor array configured for analyzing a patterned layer misalignment between different patterned layers. The MOM capacitor array includes a plurality of MOM capacitor structures formed in a plurality of patterned layers of an integrated circuit structure. Each MOM capacitor structure includes (a) a first patterned layer including a first comb-like metal component including a plurality of first layer elongated fingers, (b) a second patterned layer including a second comb-like metal component including a plurality of second layer elongated fingers, and (c) a third patterned layer between the first and second patterned layers, the third patterned layer including a plurality of vias, each via connecting a distal end of a first layer elongated finger with a distal end of a second layer elongated finger. Each MOM capacitor structure in the MOM capacitor array my have a different patterned layer alignment in at least one direction, wherein the patterned layer alignment for each MOM capacitor structure is defined by a relative alignment between the first patterned layer, the second patterned layer, and the third patterned layer.

BRIEF DESCRIPTION OF THE DRAWINGS

Example aspects of the present disclosure are described below in conjunction with the figures, in which:

FIG. 12 shows an example two-dimensional 5×5 array of MOM capacitors formed in a common set of patterned layers for detecting and analyzing a process-related layer misalignment associated with the patterned layers, according to one example embodiment;

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Embodiments of the present invention provide structures and methods for forming and using metal-oxide-metal (MOM) lateral flux capacitors to monitor interconnect process quality, for example the relative alignment of different interconnect layers, the presence of low-k process damage, and/or other interconnect quality parameters. MOM capacitors are commonly used in analog and mixed signal circuits as a low-cost capacitor, as they can be formed with no additional process steps to the background IC fabrication process, often referred to as "free" devices. The present disclosure describes various modified versions of conventional MOM capacitors, referred to herein as "MOM capacitors."

As discussed below, in some embodiments an array of MOM capacitors may be formed in patterned layers, e.g., interconnect layers, in an integrated circuit (IC) structure and analyzed to identify misalignments between the patterned layers, e.g., caused by manufacturing process variations, inaccuracies, or defects. The patterned layers (e.g., interconnect layers) in which the MOM capacitors are formed may include multiple metal layers and at least one via layer formed between adjacent metal layers. Each MOM capacitor may include comb-like metal structures defining elongated metal fingers, each separated from adjacent elongated metal fingers by an oxide or other dielectric, and vias connecting the elongated metal fingers of two adjacent metal layers.

In some embodiments, the array of MOM capacitors may be formed with different programmed layer alignments, e.g., defining different programmed via/metal alignments between the vias formed in a via layer and metal fingers formed in adjacent metal layers. After being formed on the wafer, the actual via/metal alignments of the MOM capacitors may differ from the programmed via/metal alignments, due to a process-related layer misalignment. Each MOM capacitor in the array may be electrically tested to identify the MOM capacitor having the best actual via/metal alignment closest to a target alignment. For example, a breakdown voltage may be determined for each MOM capacitor, wherein the MOM capacitor having the highest breakdown voltage is identified as the MOM capacitor having the best alignment. The programmed via/metal alignment of this best-aligned MOM capacitor may then be used to adjust the manufacturing process for at least one patterned layer to reduce the process-related layer misalignment, or take other corrective action.

Figure 1:
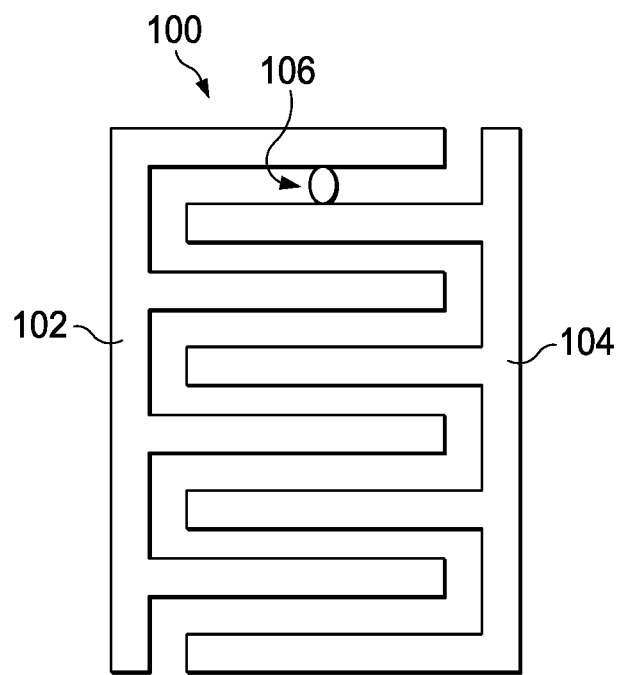
FIG. 1 shows a top view of a conventional monitoring structure including interleaved metal comb structure for detecting electrical short circuits, which may indicate an inaccuracy in a fabrication process.
Figure 2:
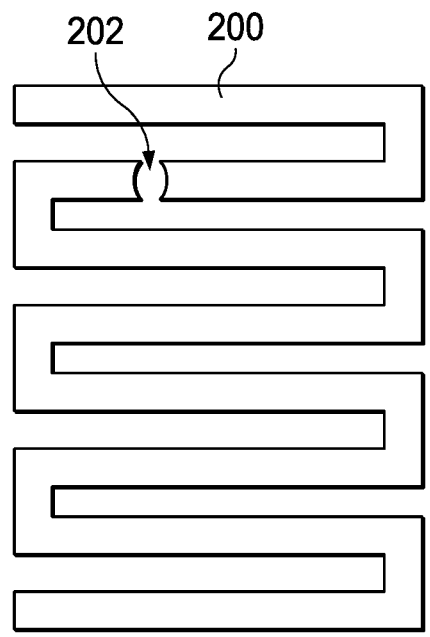
FIG. 2 shows a top view of a conventional monitoring structure including a long, serpentine metal line for monitoring interconnect quality by detecting the presence of an open circuit defined by a break in the serpentine metal line.
Figure 3:
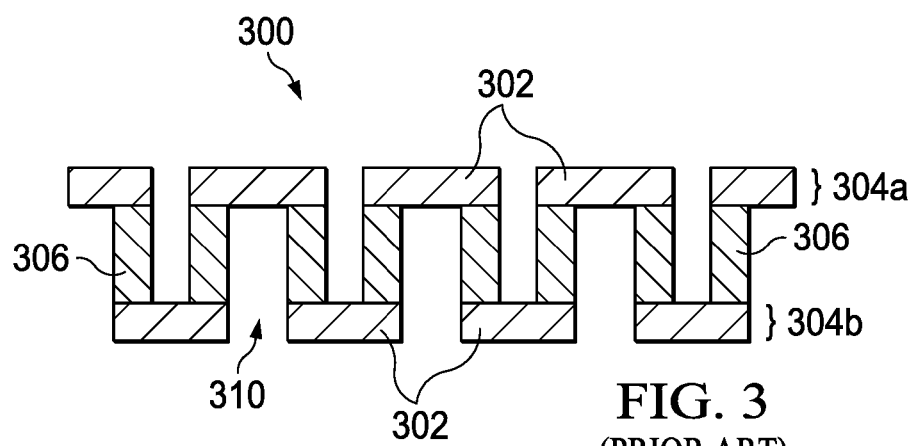
FIG. 3 shows a side cross-sectional view of a conventional monitoring arrangement including interconnect elements formed in multiple metal lines and connected by vias, to define a chain-like structure, for evaluating the quality of fabricated vias.
Figure 4A:
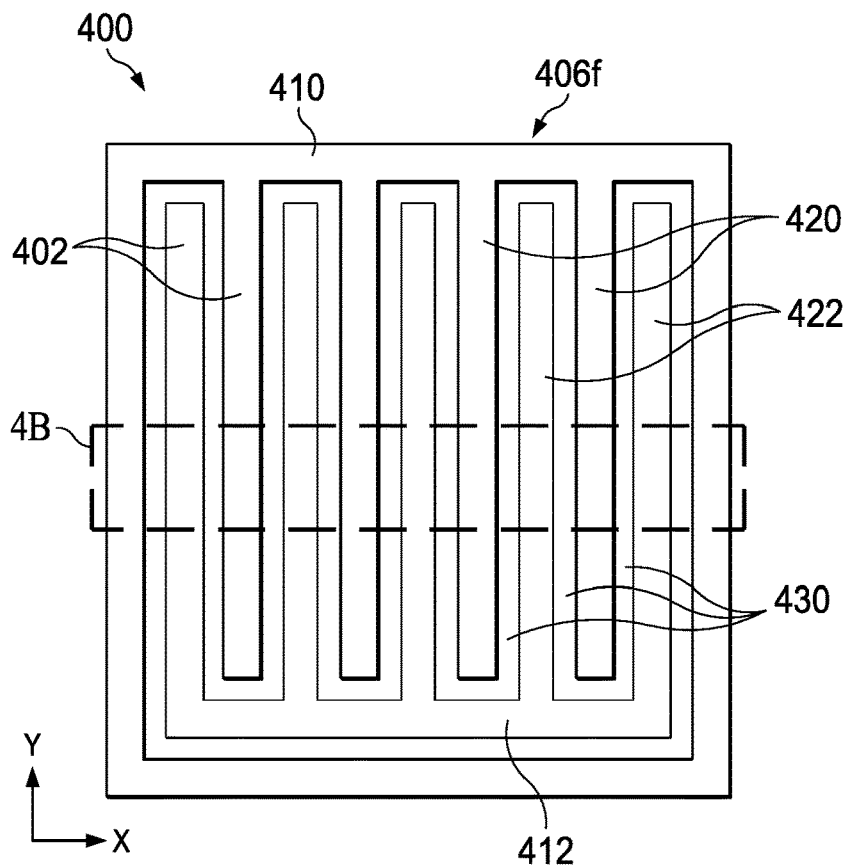
FIGS. 4A and 4B show an example of a conventional MOM capacitor 400, in particular a conventional lateral flux MOM capacitor.
Figure 4B:
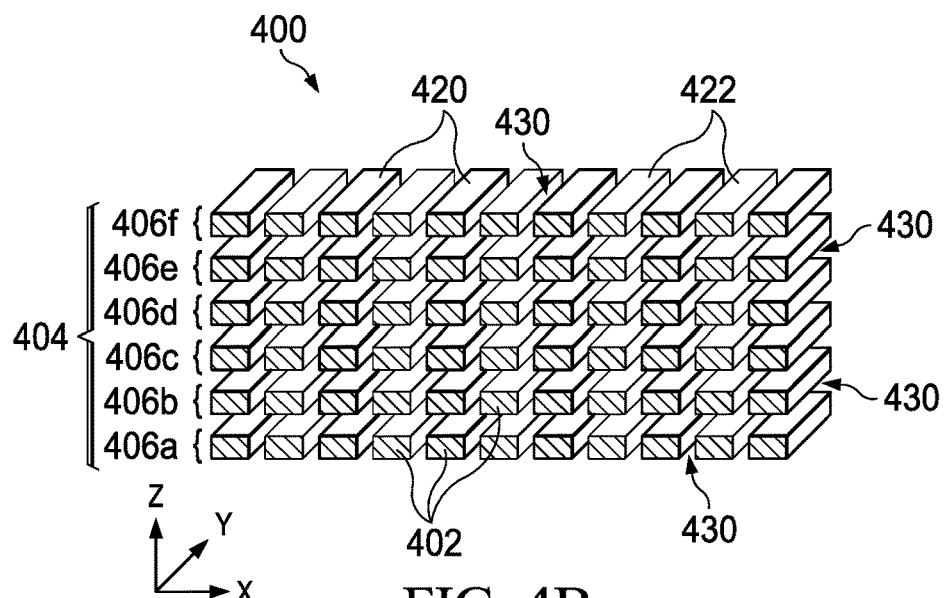

A pair of conventional MOM capacitors are first discussed to provide a better understanding of the MOM capacitors disclosed herein. FIGS. 4A and 4B show an example of a first conventional MOM capacitor 400, in particular a lateral flux MOM capacitor. FIG. 4A shows a top view of MOM capacitor 400, and FIG. 4B shows a three-dimensional cross-sectional view of a selected portion of MOM capacitor 400 indicated by the dashed rectangle labelled "4B" in FIG. 4A. As shown, MOM capacitor 400 includes capacitor elements 402 formed in multiple patterned layers 404, in this example six metal layers 406a-406f, which may be referred to as "Metal 1" (layer 406a) through "Metal 6" (layer 406f). In some IC devices, metal layers 406a-406f are interconnect layers including patterned interconnect structures for connecting various semiconductor devices, along with the capacitor elements 402 of MOM capacitor 400. Metal layers 406a-406f may be formed from aluminum or copper, for example.

The top view of MOM capacitor shown in FIG. 4A shows the top metal layer 406f. Each metal layer 406a-406f may have a similar construction, such that each metal layer 406b-406f may have a similar structure as the top metal layer 406f shown in FIG. 4A. As shown in FIG. 4A, metal layer 406a includes a pair of metal comb-like components 410 and 412 each having multiple elongated fingers 420 and 422, respectively, arranged in parallel in an interdigital (interleaved) manner and spaced apart from each other by a dielectric material 430, e.g., an oxide. As shown in FIG. 4B, the elongated fingers 420 and 422 in adjacent metal layers 406a-406f are also separate from each other by the dielectric material 430 (e.g., oxide). The operation of MOM capacitor 400 is based on coupling capacitance between the interleaved parallel metal fingers 420 and 422. The width and spacing of the metal fingers 420 and 422 are typically defined by the minimum process dimensions (e.g., 0.2 μm finger width and spacing in a 130 nm technology implementation) to achieve maximum capacitance density.

In some designs, slotted vias are formed between the metal fingers in adjacent metal layers, to further increase the capacitance density by increasing the capacitive coupling between the fingers in adjacent metal layers.

Figure 5A:
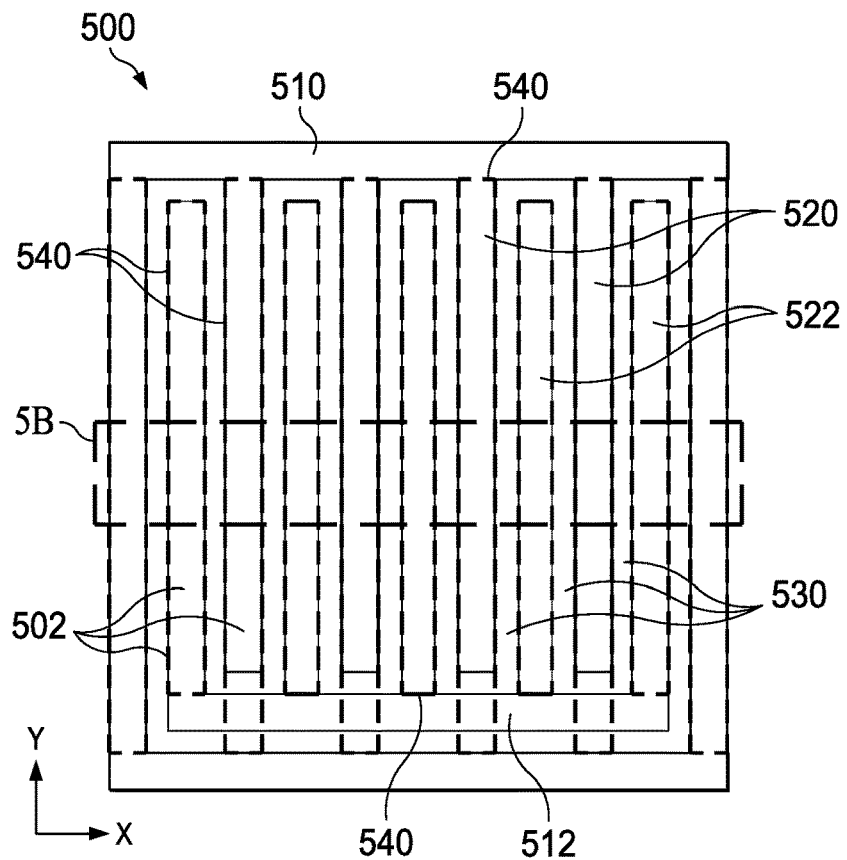
FIGS. 5A and 5B show a top view and three-dimensional cross-sectional view of a conventional MOM capacitor including a slotted via connecting the metal fingers in adjacent metal layers.
Figure 5B:
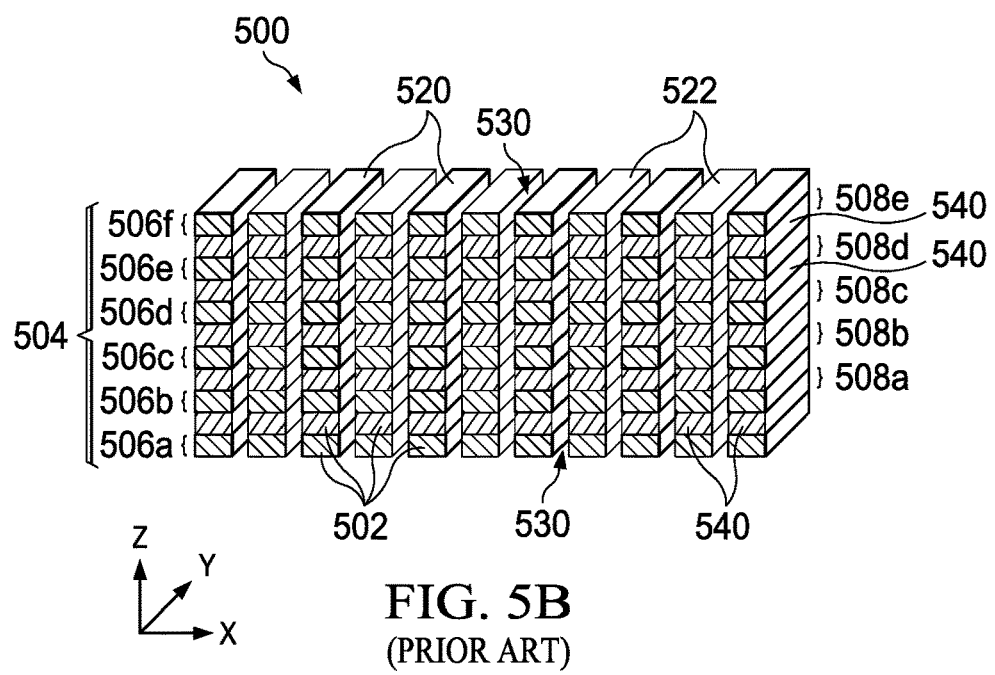

For example, FIGS. 5A and 5B show an example of a MOM capacitor 500 similar to MOM capacitor 400 shown in FIGS. 4A-4B but also including slotted vias between the metal fingers in adjacent metal layers. FIGS. 5A and 5B show a top view and three-dimensional cross-sectional view of MOM capacitor 500, respectively. As shown, MOM capacitor 500 includes capacitor elements 502 formed in multiple patterned layers 504, which in this example include (a) six metal layers 506a-506f and (b) five via layers 508a-508e respectively arranged between metal layers 506a-506f in an alternating stacked arrangement. In some IC devices, metal layers 506a-506f and via layers 508a-508e are interconnect layers including patterned interconnect structures for connecting various semiconductor devices, along with the capacitor elements 502 of MOM capacitor 500. Metal layers 506a-506f may comprise patterned aluminum, copper, or other suitable metal, for example. Via layers 508a-508e may comprise patterned tungsten, copper, or other suitable metal, for example.

As with MOM capacitor 400 discussed above, each metal layer 506a-506f of MOM capacitor 500 includes a pair of metal comb-like components 510 and 512 having multiple elongated fingers 520 and 522, respectively, arranged in parallel in an interdigital (interleaved) manner and spaced apart from each other by a dielectric material 530, e.g., an oxide. Unlike MOM capacitor 400 (in which the elongated fingers 420 and 422 of adjacent metal layers 406a-406f are separated by dielectric material 430), the elongated fingers 520 and 522 of adjacent metal layers 506a-506f of MOM capacitor 500 are electrically coupled to each other by elongated metal vias (or "slotted vias") 540 formed in each of via layers 508a-508e. The slotted via 540 connecting the respective elongated fingers 520 and 522 of adjacent metal layers 506a-506f may further increase the capacitive density of the MOM capacitor 500, e.g., as compared with MOM capacitor 400 formed without slotted via 540.

Some embodiments of the present disclosure involve forming and using a MOM capacitor, for example comprising a modified version of MOM capacitor 400 or 500 discussed above, for evaluating or monitoring the structure and/or process quality for patterned layers in an IC device structure, for example the relative alignment of different patterned layers (e.g., interconnect layers), the presence of low-k process damage in patterned layers, and/or other quality parameters.

As discussed below, in some embodiments, MOM capacitors may be formed with a strategically located vias, for example vias located at the distal ends ("fingertips") of the elongated metal fingers of interleaved comb-like components, to detect and analyze via/metal layers misalignments, in both x and y directions. Electrical tests may be performed on the MOM capacitors to evaluate the via/metal alignments. In some embodiments an array of MOM capacitors may be programmed with different programmed layer alignments and formed in common patterned layers on a wafer. Electrical tests may be performed on the array of MOM capacitors to evaluate the actual layer alignments of the MOM capacitors, which may differ from the programmed layer alignments due a process-related misalignment affected the array of MOM capacitors. For example, a breakdown voltage may be determined for each MOM capacitor in the array, which indicates the accuracy of the actual layer alignment (e.g., with respect to a target alignment) in each MOM capacitor, based on the knowledge that the breakdown voltage of a MOM capacitor decreases with increased via/metal misalignment in one or both of the x and y directions.

The strategically located vias, for example at the distal fingertips of the elongated metal fingers, provide an improved ability to monitor patterning misalignment (e.g., photo misalignment) as compared with a conventional MOM capacitor 400 or 500. First, the conventional MOM capacitor 400 shown in FIGS. 4A-4B does not include via. The MOM breakdown voltage is typically controlled by the distance between adjacent metal fingers in each layer and/or by deficiencies in the etch process (e.g., under etch) or post-etch cleaning (e.g., leaving metal stringers), not by photo alignment or misalignment. Second, MOM capacitor 500 shown in FIGS. 5A-5B, which includes numerous slotted (elongated) via 540, is also inadequate for evaluating patterning misalignment/photo misalignment. The slotted via 540 are typically less controlled, and any slight enlargement in the slotted via size along the elongated direction of the via (for example due to line edge roughness) may substantially reduce the breakdown voltage. Thus, the breakdown voltage of the conventional MOM capacitor 500 is typically very low, and does not reflect patterning alignment or misalignment. In contrast, the breakdown voltage of the disclosed MOM capacitor structure, including strategically located vias (e.g., at the distal fingertips of the metal fingers) is substantially more sensitive to patterning alignment/misalignment.

FIGS. 6A-6B through FIGS. 9A-9B illustrate four example MOM capacitors 600a-600d formed on a wafer, each with a different actual layer alignment (between a via layer and adjacent metal layers) in the x and y directions. As discussed below with reference to FIG. 12, the different actual layer alignments of the four example MOM capacitors 600a-600d may result from different programmed layer alignments for the MOM capacitors 600a-600d.

Figure 6A:
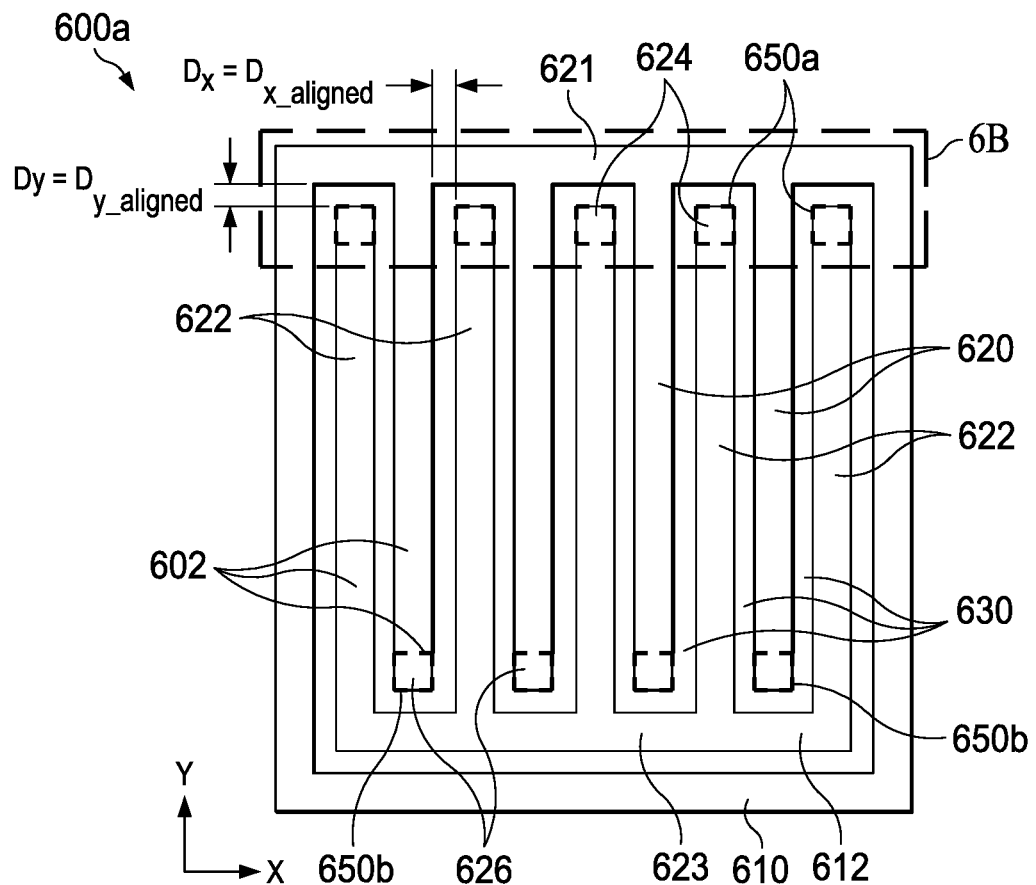
FIGS. 6A and 6B show a top view and three-dimensional cross-sectional view of a MOM capacitor for analyzing patterned layer alignments, wherein a via layer is formed with a target alignment relative to adjacent metal layers, according to one example embodiment.
Figure 6B:
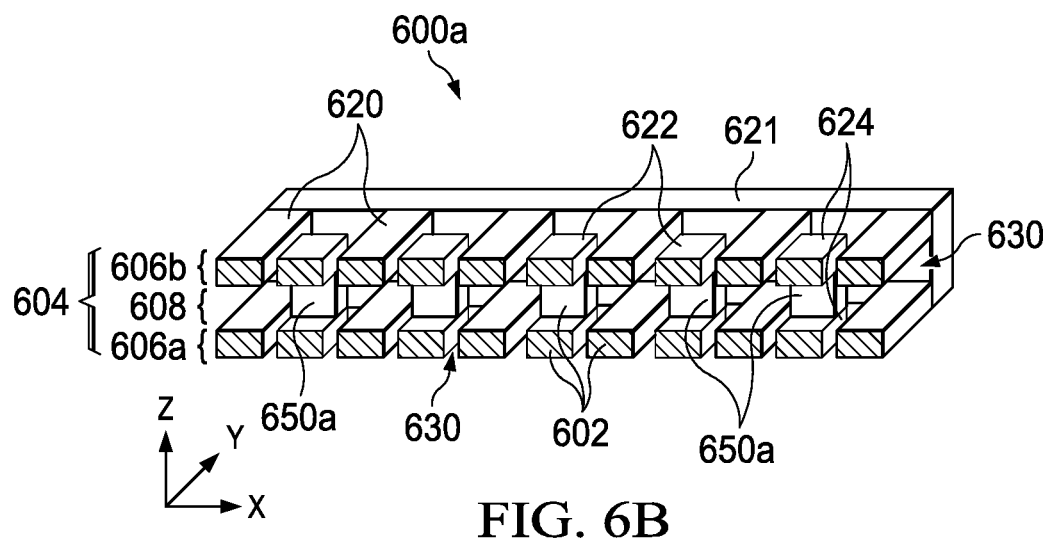

FIGS. 6A and 6B show an example MOM capacitor 600a (in particular, a modified version of a conventional MOM lateral flux capacitor) that may be used to analyze the relative alignment of patterned layers formed in an IC structure, e.g., to monitor via/metal layer misalignment, according to one example embodiment. In particular, the MOM capacitor 600a (or an array of similar MOM capacitors having different layer alignments, as discussed below) may be used to detect patterned layer misalignments resulting from an inaccurate or flawed fabrication process, such that a corrective action may be initiated (e.g., discarding IC structures or devices having an unwanted misalignment or misalignment-related performance, or adjusting the fabrication process to reduce the process-related misalignment. In some embodiments, the MOM capacitor 600a (or array of similar MOM capacitors) may be formed in a scribe line, or as part of Wafer Acceptance Test (WAT) structures, or at any other suitable location on a wafer.

FIG. 6A shows a top view of MOM capacitor 600a, and FIG. 6B shows a three-dimensional cross-sectional view of a selected portion of MOM capacitor 600a indicated by the dashed rectangle labelled "6B" in FIG. 6A. As shown, MOM capacitor 600a includes capacitor elements 602 formed in multiple patterned layers 604, in this example a pair of adjacent metal layers 606a and 606b and a via layer 608 formed between metal layers 606a and 606b. In some IC devices, metal layers 606a and 606b and via layer 608 are interconnect layers including patterned interconnect structures for connecting various semiconductor devices, along with the capacitor elements 602 of MOM capacitor 600a. Metal layers 606a and 606b may comprise patterned aluminum, copper, or other suitable metal, for example, and may be formed at any depth in an IC structure. Via layer 608 may comprise patterned tungsten, copper, or other suitable metal, for example.

As with conventional MOM capacitors 400 and 500 discussed above, each metal layer 606a and 606b of MOM capacitor 600a includes a pair of metal comb-like components 610 and 612. Each metal comb-like component 610 includes multiple elongated fingers 620 extending from a comb base 621, and each metal comb-like component 612 includes multiple elongated fingers 622 extending from a comb base 623. Elongated fingers 620 and 622 of metal comb-like components 610 and 612, respectively, are arranged in parallel in an interdigital (interleaved) manner and spaced apart from each other by a dielectric material 630, e.g., an oxide. Via layer 608 includes vias 650a and 650b, where each via 650a is formed at a distal tip ("fingertip") 624 of each elongated finger 622 and each via 650b is formed at a fingertip 626 of each elongated finger 620, such that each via 650a, 650b provides a conductive connection between the respective fingertip 624, 626 of a particular elongated finger 620, 622 formed in metal layer 606b with the respective fingertip 624, 626 of a corresponding elongated finger 620, 622 formed in the underlying metal layer 606a.

The lateral alignment of vias 650a, 650b relative to other capacitor elements 602, in particular metal comb-like components 610 and 612 formed in metal layers 606a and 606b, may affect various electrical properties of the MOM capacitor 600a. For example, the lateral alignment of vias 650a, 650b in the x-direction influences the distance between each via 650a, 650b and laterally adjacent (in the x-direction) metal fingers 620, 622 in metal layers 606a and 606b, and the lateral alignment of vias 650a, 650b in the y-direction influences the distance (in the y-direction) between each via 650a and the comb base 621 and between each via 650b and the comb base 623.

The respective distances between vias 650a, 650b and adjacent capacitor elements 602 affect the breakdown voltage ($V_{breakdown}$) of the MOM capacitor 600a. In particular, decreasing the distance between a via 650a or 650b and an adjacent capacitor elements 602 decreases the breakdown voltage of the MOM capacitor 600a. Thus, as discussed below, the alignment between vias 650a, 650b and metal comb-like components 610 and 612, which represents the alignment between via layer 608 and metal layers 606a and 606b, can be analyzed by measuring the breakdown voltage of the MOM capacitor 600a. In some embodiments, as discussed below, the breakdown voltage may be measured and analyzed for multiple MOM capacitors 600a, each formed with a different programmed alignment, to identify and correct a misalignment between via layer 608, metal layer 606a, and/or metal layer 606b.

The vias 650a, 650b shown in FIGS. 6A-6B are precisely aligned with respective fingertips 624, 626 in both the x-direction and y-direction. Thus, the actual layer alignment (ALA) of the via layer 608 matches a target alignment for via layer 608. In this aligned arrangement, each via 650a is spaced in the x-direction from each adjacent elongated finger 620, and each via 650b is spaced in the x-direction from each adjacent elongated finger 622, by a distance $D_x=D_{x\_aligned}$. Further, each via 650a is spaced in the y-direction from comb base 621, and each via 650b is spaced in the y-direction from comb base 623, by a distance $D_y=D_{y\_aligned}$.

A misalignment of vias 650a, 650b in the x-direction reduces the distance $D_x$ between each via 650a, 650b and certain laterally-adjacent elongated fingers 620 or 622, which typically reduces the breakdown voltage ($V_{breakdown}$) of the MOM capacitor 600a. Similarly, a misalignment of vias 650a, 650b in the y-direction reduces the distance $D_y$ between vias 650a and comb base 621 or between vias 650b and comb base 623, depending on the particular direction of misalignment. Example misalignments in the x-direction and y-direction are shown in FIGS. 7A-9B, discussed below.

Figure 7A:
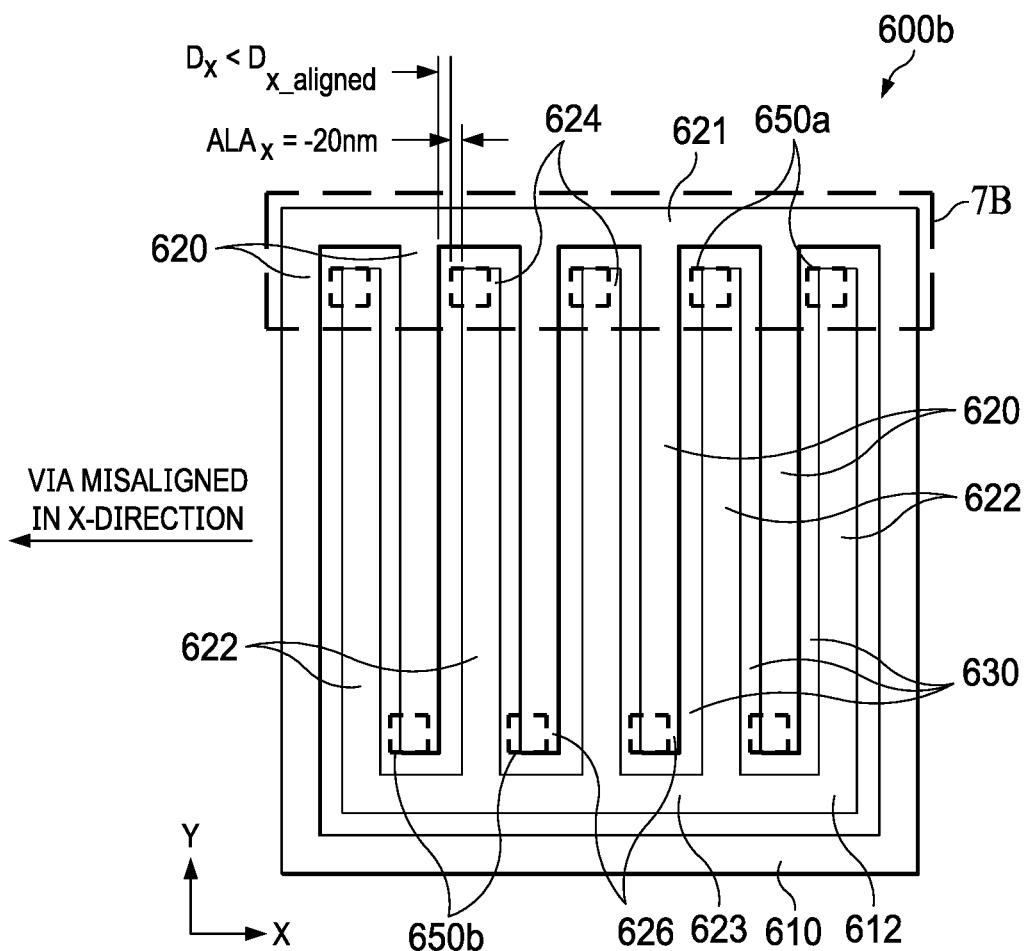
FIGS. 7A and 7B show a top view and three-dimensional cross-sectional view of a MOM capacitor for analyzing patterned layer alignments, wherein the via layer is formed misaligned from adjacent metal layers in an x-direction, according to one example embodiment.
Figure 7B:
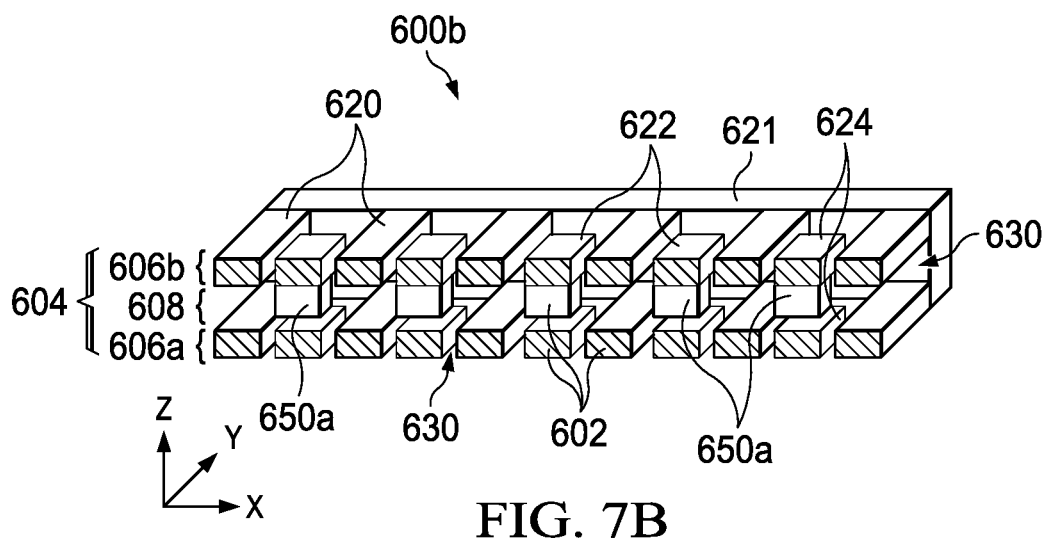

FIGS. 7A and 7B show the top view and three-dimensional cross-sectional view of an example MOM capacitor 600b, which is similar to MOM capacitor 600a shown in FIGS. 6A-6B but with the via layer 608, including vias 650a and 650b, formed misaligned from metal layers 606a and 606b in the x-direction. Thus, vias 650a and 650b are misaligned from fingertips 624 and 626, respectively, in the x-direction. As shown, the actual layer alignment (ALA) of the via layer 608 is misaligned from a target via/metal alignment by −20 nm in the x-direction, while matching the target alignment in the y-direction. As a result, the distance $D_x$ between each via 650a, 650b and adjacent metal fingers 620 or 622 is less than the aligned distance $D_{x\_aligned}$ shown in FIGS. 6A-6B, which reduces the breakdown voltage ($V_{breakdown}$) of the MOM capacitor 600b, as compared with the MOM capacitor 600a with aligned via shown in FIGS. 6A-6B.

Figure 8A:
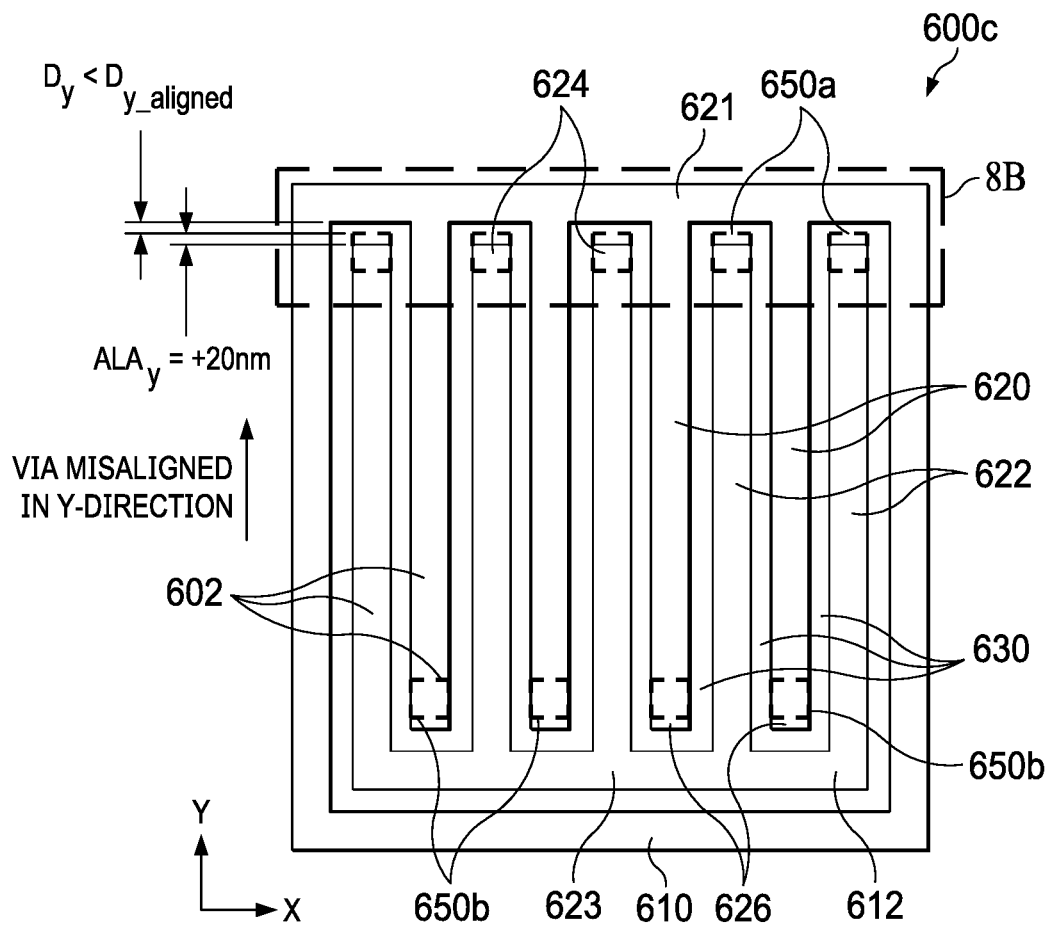
FIGS. 8A and 8B show a top view and three-dimensional cross-sectional view of a MOM capacitor for analyzing patterned layer alignments, wherein the via layer is formed misaligned from adjacent metal layers in a y-direction, according to one example embodiment.
Figure 8B:
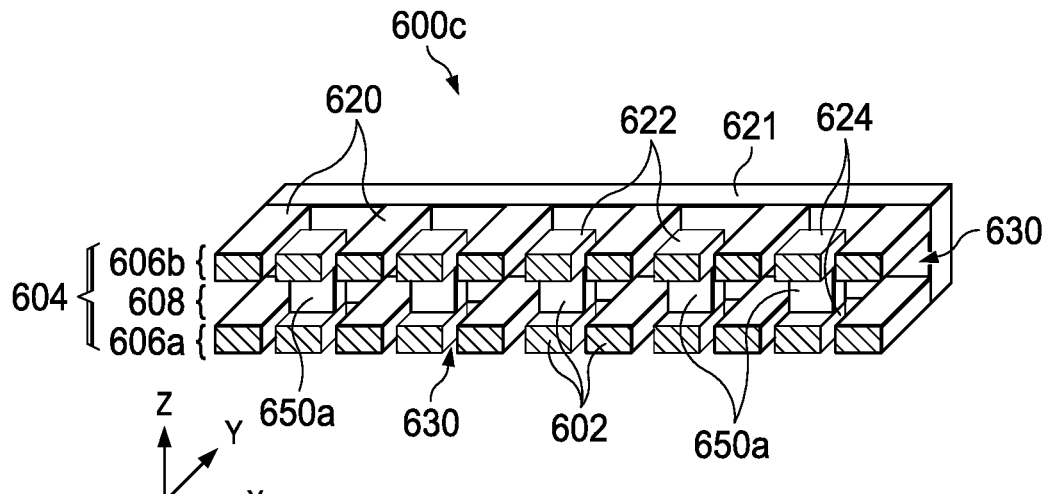

FIGS. 8A and 8B show the top view and three-dimensional cross-sectional view of an example MOM capacitor 600c, which is similar to MOM capacitor 600a shown in FIGS. 6A-6B but with the via layer 608, including vias 650a and 650b, formed misaligned from metal layers 606a and 606b in the y-direction. Thus, vias 650a and 650b are misaligned from fingertips 624 and 626, respectively, in the y-direction. As shown, the actual layer alignment (ALA) of the via layer 608 is misaligned from a target via/metal alignment by +20 nm in the y-direction, while matching the target alignment in the x-direction. As a result, the distance $D_y$ between each via 650a and comb base 621 is smaller than the aligned distance $D_{y\_aligned}$ shown in FIGS. 6A-6B, which reduces the breakdown voltage ($V_{breakdown}$) of the MOM capacitor 600c, as compared with the MOM capacitor 600a with aligned via shown in FIGS. 6A-6B.

Figure 9A:
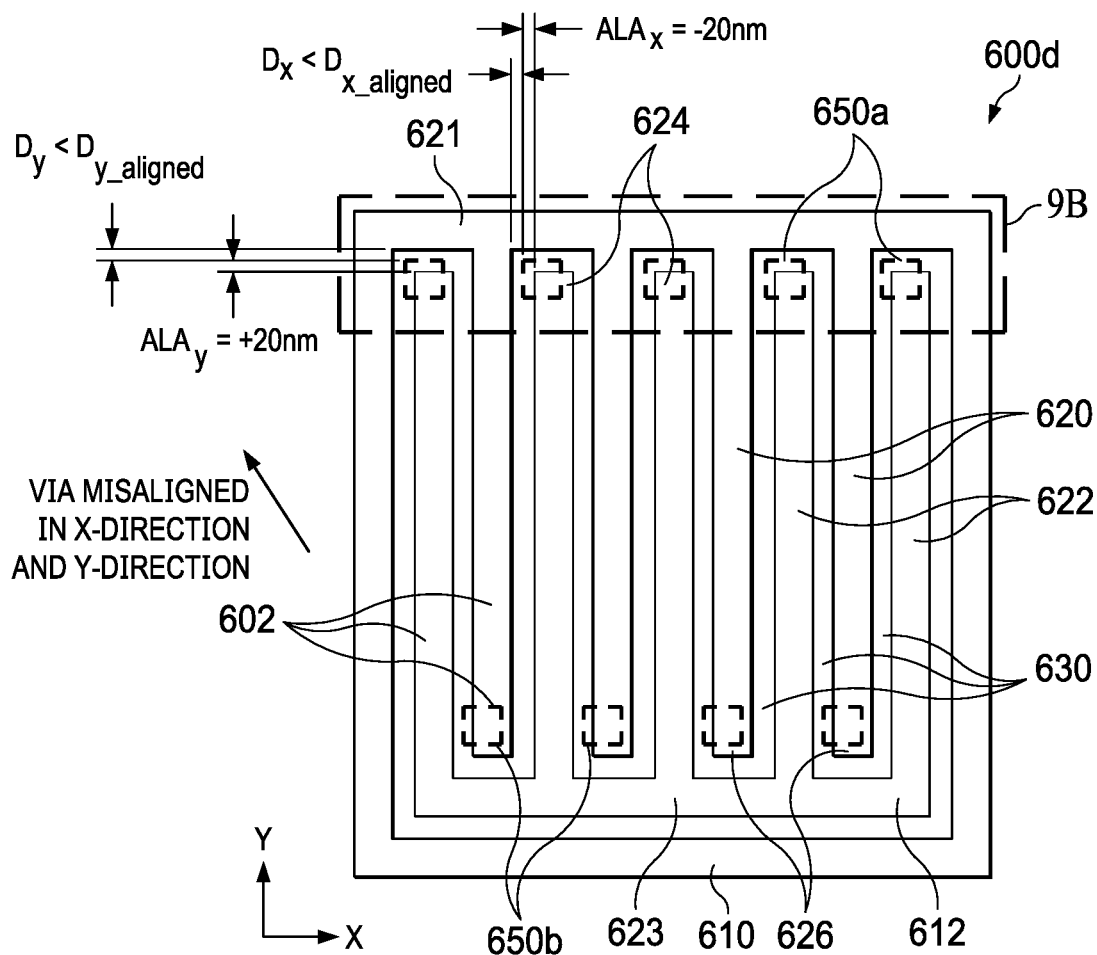
FIGS. 9A and 9B show a top view and three-dimensional cross-sectional view of a MOM capacitor for analyzing patterned layer alignments, wherein the via layer is formed misaligned from adjacent metal layers in both x-direction and y-direction, according to one example embodiment.
Figure 9B:
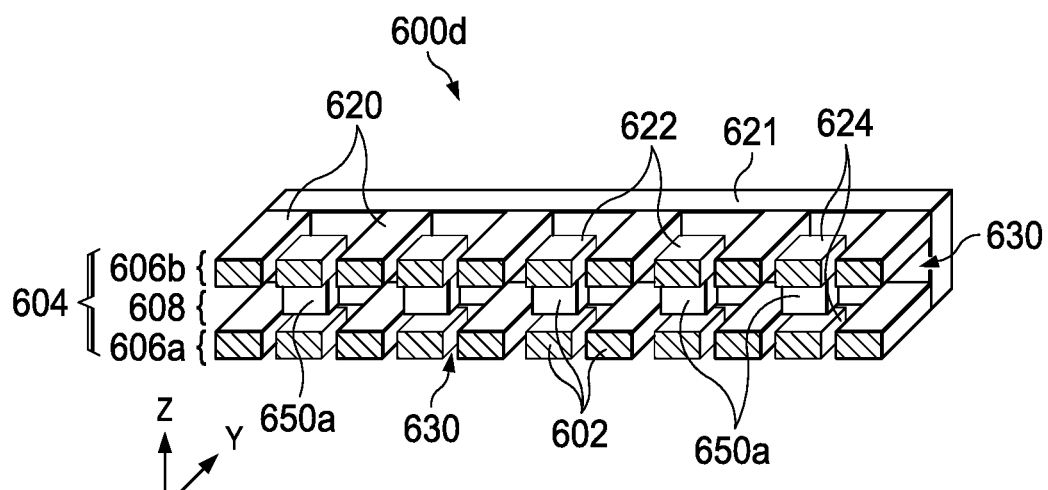

FIGS. 9A and 9B show the top view and three-dimensional cross-sectional view of an example MOM capacitor 600d, which is similar to MOM capacitor 600a shown in FIGS. 6A-6B but with the via layer 608, including vias 650a and 650b, formed misaligned from metal layers 606a and 606b in both the x-direction and the y-direction. As shown, the actual layer alignment (ALA) of the via layer 608 is misaligned from the target alignment by −20 nm in the x-direction and +20 nm in the y-direction. As a result, (a) the distance $D_y$ between each via 650a and comb base 621 is smaller than the aligned distance $D_{y\_aligned}$ shown in FIGS. 6A-6B, and (b) the distance $D_y$ between each via 650a and comb base 621 is smaller than the aligned distance $D_{y\_aligned}$ shown in FIGS. 6A-6B, which reduces the breakdown voltage ($V_{breakdown}$) of the MOM capacitor 600d, as compared with the MOM capacitor 600a with aligned via shown in FIGS. 6A-6B.

Although the example MOM capacitors 600a-600d shown in FIGS. 6A-6B through FIGS. 9A-9B include two metal layers 606a and 606b with a single via layer 608 formed between the two metal layers 606a and 606b, in other embodiments or instances the MOM capacitor may include any other number of metal layers with any number of via layers formed between two or more of the metal layers.

Figure 10:
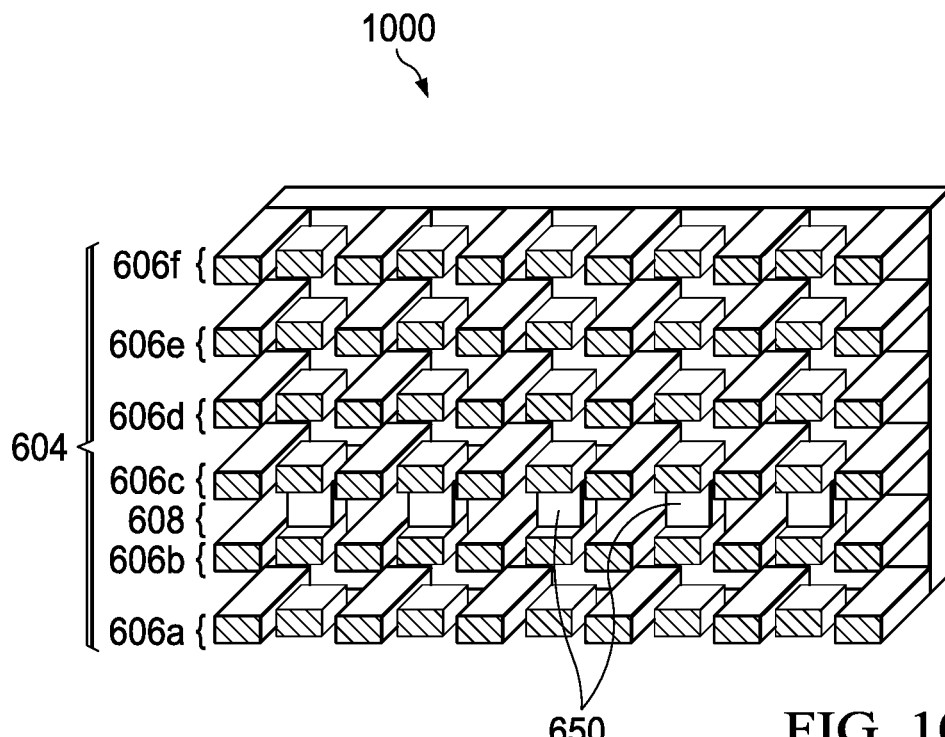
FIG. 10 shows a three-dimensional cross-sectional view of a portion of an example MOM capacitor including six metal layers and a single via layer formed between a selected pair of the six metal layers, for evaluating the alignment of the via layer relative to the selected pair of metal layers, according to one example embodiment.

For example, FIG. 10 shows a three-dimensional cross-sectional view of a portion of an example MOM capacitor 1000, corresponding with the three-dimensional cross-sectional views shown in FIGS. 6B, 7B, 8B, and 9B. MOM capacitor 1000 and the elements thereof are similar to MOM capacitors 600a-600d discussed above, but MOM capacitor 1000 is formed from components of seven patterned layers, including six metal layers 606a-606f and a single via layer 608 including vias 650 formed between a selected pair of the six metal layers 606a-606f, in this example metal layers 606b and 606c. The example MOM capacitor 1000 may thus be used to analyze the relative alignment between via layer 608 and metal layer 606b and/or 606c. The single via layer 608 may be formed between any adjacent pair of the six metal layers 606a-606f to analyze the alignment of such via layer 608 relative to the selected pair of metal layers.

Figure 11:
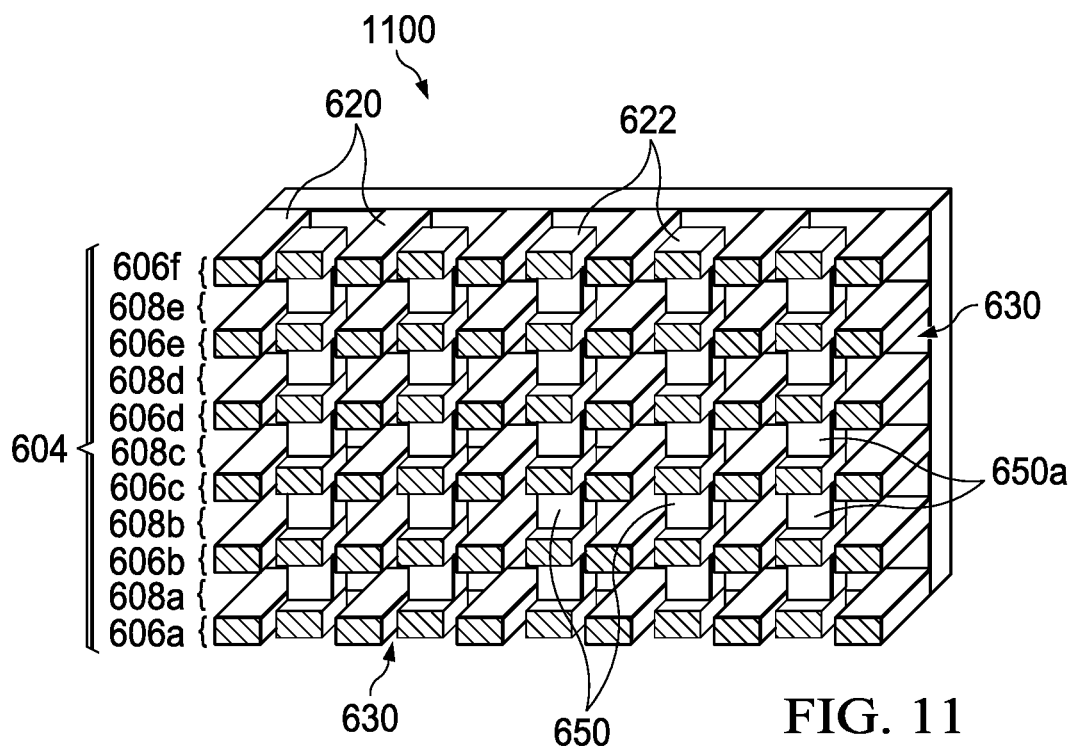
FIG. 11 shows a three-dimensional cross-sectional view of a portion of an example MOM capacitor including six metal layers and a respective via layer formed between each adjacent pair of the six metal layers, for evaluating the overall layer alignment of the patterned layers, according to one example embodiment.

As another example, FIG. 11 shows a three-dimensional cross-sectional view of a portion of an example MOM capacitor 1100. MOM capacitor 1100 and the elements thereof are similar to MOM capacitor 1000 discussed above, but MOM capacitor 1100 is formed from components of 11 patterned layers, including five via layers 608a-608e formed between six metal layers 606a-606f in an alternating manner. The example MOM capacitor 1100 may be used to detect the presence of patterned layer misalignment(s) among the 11 patterned layers, which may initiate a further analysis (e.g., microscopic or scanned cross-sectional views) to detect the location and details of the patterned layer misalignment(s).

As discussed above, multiple MOM capacitors may be formed with different programmed layer alignments (e.g., via/metal alignments) to analyze the actual layer alignment of different patterned layers formed on the wafer, which may differ from the programmed alignment of such patterned layers due to process variations, inaccuracies, or defects (e.g., photolithography process variations, inaccuracies, or defects). For example, in some embodiments, an array of MOM capacitors may be formed on a wafer, each designed with a different programmed layer alignment.

FIG. 12 shows an example table 1200 of a two-dimensional 5×5 array of MOM capacitors $600_1$-$600_{25}$ formed in common patterned layers in an IC structure for detecting and analyzing a process-related layer misalignment associated with the patterned layers, e.g., due to due to process variations, inaccuracies, or defects, according to one example embodiment. For example, MOM capacitors $600_1$-$600_{25}$ may be similar to MOM capacitors 600a-600d shown in FIGS. 6A-6B through 9A-9B and discussed above. Thus, in this example, MOM capacitors $600_1$-$600_{25}$ are formed in three vertically adjacent patterned layers, in particular, a via layer formed between two metal layers, e.g., via layer 608 formed between metal layers 606a and 606b as shown in FIGS. 6A-6B through 9A-9B. MOM capacitors $600_1$-$600_{25}$ may be formed in the same patterned layers, using common photomasks or reticles. Thus, any process-related misalignment between the patterned layers will similarly influence the alignment of all MOM capacitors $600_1$-$600_{25}$.

MOM capacitors $600_1$-$600_{25}$ may be designed with different programmed layer alignments, e.g., defining a programmed alignment in the x-direction and y-direction between a via layer and at least one adjacent metal layer. Table 1200 indicates the programmed layer alignment (PLA) in the x- and y-directions (in nm) for each of the 25 MOM capacitor $600_1$-$600_2$5, which indicates a programmed misalignment from a target alignment of the via layer relative to the two metal layers. In this example array, MOM capacitor $600_{13}$ is programmed with target alignment (i.e., via/metal misalignment of 0 nm, 0 nm), while MOM capacitors $600_1$-$600_{12}$ and $600_{14}$-$600_{25}$ are programmed with various misalignments from the target alignment. For example, MOM capacitor $600_9$ has a programmed layer alignment (PLA) of +10 nm, +10 nm, meaning the via layer is designed to be misaligned from the two adjacent metal layers by 10 nm in the positive x-direction and 10 nm in positive y-direction. The programmed layer alignments of MOM capacitors $600_1$-$600_{25}$ may be programmed encoded in the photomasks, reticles, or other process equipment used to form the patterned layers in which MOM capacitors $600_1$-$600_{25}$ are formed.

As discussed above, when the array of MOM capacitors $600_1$-$600_{25}$ are actually formed on the wafer, a process-related layer misalignment between the via layer and metal layer(s) may affect the array of MOM capacitors $600_1$-$600_{25}$, such that the actual layer alignment (ALA) of each MOM capacitor $600_1$-$600_{25}$ differs from its programmed layer alignment (PLA). Thus, the ALA of each MOM capacitor $600_1$-$600_{25}$ is the net of the respective PLA and the process-related layer misalignment. Table 1200 shows the actual layer alignment (ALA) of each MOM capacitor $600_1$-$600_{25}$ resulting from a fabrication process that includes a process-related layer misalignment of −10 nm, +10 nm. For example, as shown in table 1200, MOM capacitor $600_9$ discussed above, having a programmed layer alignment (PLA) of +10 nm, +10 nm, is formed on the wafer with an actual layer alignment (ALA) of 0 nm, +20 nm, meaning the vias of the formed MOM capacitor $600_9$ are aligned with metal layers in the x-direction but misaligned from the metal layers by 20 nm in the positive y-direction. Thus, in comparison to the programmed layer alignment of MOM capacitor $600_9$ (+10 nm, +10 nm) the process-related layer misalignment (of −10 nm, +10 nm) brought the vias of MOM capacitor $600_9$ into the target alignment in the x-direction (0 nm misalignment), but further away from the target alignment in the x-direction (20 nm misalignment).

Table 1200 also indicates four MOM capacitors having an ALA represented by FIGS. 6A-6D through 9A-9D. In particular, MOM capacitor $600_{19}$ has an ALA corresponding with MOM capacitor 600a shown in FIGS. 6A-6B; MOM capacitor $600_{17}$ has an ALA (−20 nm, 0 nm) corresponding with MOM capacitor 600b shown in FIGS. 7A-7B (−20 nm, 0 nm); MOM capacitor $600_9$ has an ALA (0 nm, +20 nm) corresponding with MOM capacitor 600c shown in FIGS. 8A-8B; and MOM capacitor $600_7$ has an ALA (−20n m, +20 nm) corresponding with MOM capacitor 600d shown in FIGS. 9A-9B.

To determine or approximate the process-related layer misalignment affecting MOM capacitors $600_1$-$600_{25}$, each MOM capacitor in the array may be electrically tested. For example, as discussed above, a breakdown voltage may be determined for each MOM capacitor $600_1$-$600_{25}$ in the array, wherein the breakdown voltage increases as the ALA approaches the target alignment, and decreases as the ALA becomes further misaligned from the target alignment. Table 1200 indicates an example breakdown voltage $V_{breakdown}$ measured for each MOM capacitor $600_1$-$600_{25}$. As shown, MOM capacitor $600_{19}$ has the highest breakdown voltage ($V_{breakdown}$=50). It can thus be deduced that MOM capacitor $600_{19}$ is the most closely aligned with the target alignment.

In some embodiment, a corrective action may be initiated based on the determined process-related layer misalignment. For example, the determined process-related layer misalignment, or a resulting performance characteristic (e.g., breakdown voltage $V_{breakdown}$) may be compared with defined limits or otherwise analyzed, and based on the results, a determination may be made to discard IC structures or devices manufactured using the process associated with the process-related layer misalignment.

In other embodiments, the programmed layer alignment (PLA) of MOM capacitor $600_{19}$ (i.e., the MOM capacitor having the best ALA) may be used to adjust the manufacturing process to reduce the process-related layer misalignment. That is, because the PLA of the MOM capacitor $600_{19}$ is +10 nm, −10 nm, it can be deduced that the process-related misalignment is approximately −10 nm, +10 nm. This approximated process-related misalignment may then be used to evaluate and/or improve the manufacturing process, for example to trigger additional process evaluation and/or to adjust one or more process steps to reduce the approximated process-related misalignment.

The array of MOM capacitors $600_1$-$600_{25}$ may be formed as a physical two-dimensional array, or the MOM capacitors $600_1$-$600_{25}$ may be arranged in any other physical arrangement, e.g., in a strip arranged in a scribe line, or scattered over available areas in a scribe region, and the two dimensional array of data can then be constructed during data analysis. Thus, the term "two-dimensional" or "2D" in the context of a two-dimensional array of MOM capacitors refers to the two directions of alignment or misalignment between the different patterned layers forming the MOM capacitors, in particular alignments/misalignments in both the x and y directions. In addition, although the example array of MOM capacitors $600_1$-$600_{25}$ is a 5×5 array including 25 MOM capacitors, the array of MOM capacitors used for evaluating a process-related layer alignment as disclosed herein may include any number of MOM capacitors.

A larger array of MOM capacitors may be used to detect larger process-related misalignments or to increase the resolution (granularity) of the misalignment detection. The resolution of the misalignment detection can be increased or decreased by changing the step size between adjacent MOM capacitors in the array. For instance, the example implementation shown in FIG. 12 uses a step size of 10 nm in both the x-direction and y-direction. The resolution of misalignment detection can be increased by decreasing this step size, for example to 5 nm, and vice versa.

Figure 13:
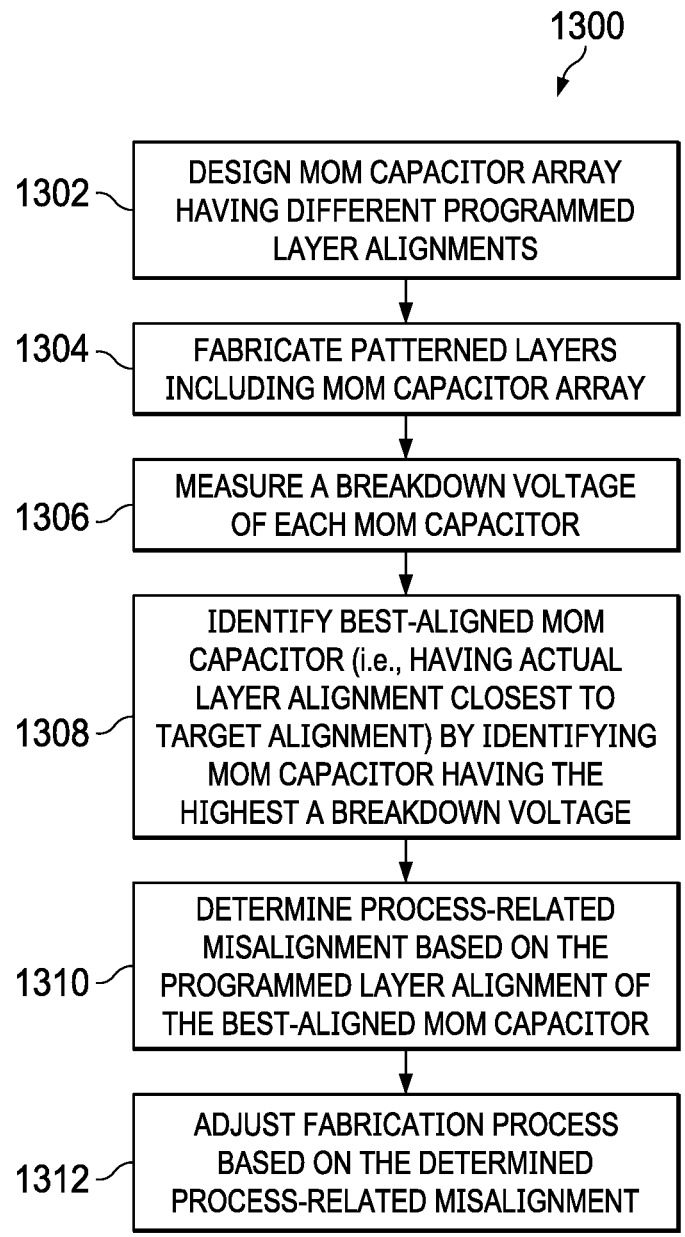
FIG. 13 shows an example method for determining a process-related misalignment between patterned layers in an IC structure and taking a corrective action, according to one example embodiment.

FIG. 13 shows an example method 1300 for determining a process-related misalignment between patterned layers in an IC structure and taking a corrective action, according to one example embodiment. At 1302, an MOM capacitor array may be designed, wherein the array includes a plurality of MOM capacitors having different programmed layer alignments relative to a target alignment, e.g., the 5×5 MOM capacitor array discussed above with respect to FIG. 12. At 1304, an IC structure may be fabricated, including fabrication of the patterned layers including the MOM capacitor array. As discussed above, each MOM capacitor in the array may be formed with an actual layer alignment (ALA), which may differ from the programmed layer alignment (PLA) due to a process-related layer misalignment.

At 1306, a breakdown voltage of each MOM capacitor may be measured. At 1308, the MOM capacitor having the highest a breakdown voltage may be identified, which may represent the best-aligned MOM capacitor in the array, i.e., the MOM capacitor having an ALA closest to target alignment. At 1310, the process-related layer misalignment may be determined based on the PLA of the identified best-aligned MOM capacitor. In particular, the process-related layer misalignment may be determined as the reverse of the PLA in both the x-direction and y-direction. As 1312, the fabrication process for at least one of the patterned layers in which the MIM capacitor is formed may be adjusted to reduce the process-related layer misalignment for subsequently formed structures.

In other embodiments, a MOM capacitor may be used to monitor damage present in low-k dielectric material in an IC device. In advanced CMOS (complementary metal-oxide-semiconductor) technology, low-k dielectric materials (e.g., as organosilicate glass and its porous form) are often used to reduce RC delay (i.e., the delay in signal speed through circuit wiring due to resistance and capacitance) associated with interconnect structures in the device. Carbon and porosity are often introduced in the low-k dielectric materials to lower the dielectric constant. However, the low-k dielectric materials may be subject to plasma-induced damage during the fabrication process, e.g., during plasma etching, particularly resist ashing. For example, the low-k material, which is hydrophobic due to large concentrations of methyl group elements, becomes hydrophilic when exposed to an oxygen-containing plasma, where methyl (–CH3) is replaced by hydroxyl (—OH). As another example, low-k materials may crack from mechanical stress (e.g., during a CMP process) or thermal stress. Damaged low-k materials may have significantly higher dielectric constant (k) values, or significantly reduced breakdown voltage, which may be detrimental to circuit performance.

Some embodiments of the present disclosure provide a MOM capacitor with a low-k dielectric material (in place of the typical oxide dielectric) between the metal fingers, which can be used as a process monitor to evaluate or detect changes in the dielectric constant (k) of the low-k dielectric material.

Figure 14:
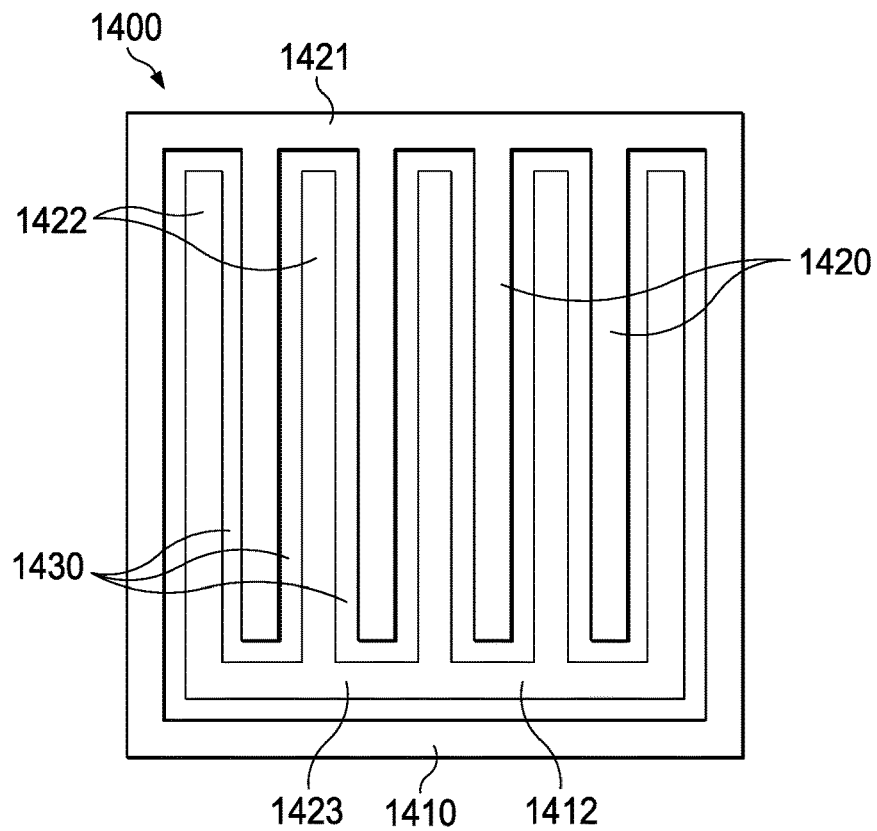
FIG. 14 shows a top view of an example MOM capacitor for monitoring low-k dielectric material damage, according to one example embodiment.

FIG. 14 shows a top view of an example MOM capacitor 1400 for monitoring low-k dielectric material damage, according to one example embodiment. MOM capacitor 1400 may comprise patterned aluminum, copper, or other suitable metal, for example, and may be formed at any depth in an IC structure. In particular, MOM capacitor 1400 may include a pair of metal comb-like components 1410 and 1412. Each metal comb-like component 1410 includes multiple elongated fingers 1420 extending from a comb base 1421, and each metal comb-like component 1412 includes multiple elongated fingers 1422 extending from a comb base 1423. Elongated fingers 1420 and 1422 of metal comb-like components 1410 and 1412 are arranged in parallel in an interdigital (interleaved) manner and spaced apart from each other by a low-k dielectric material 1430, e.g., organosilicate glass and its porous form.

MOM capacitor 1400 including the low-k dielectric material 1430 can be tested to detect or evaluate damage to the low-k material 1430. Low-k dielectric materials are often used in integrated circuit interconnect structures to reduce RC delay and improve chip speed. Carbon and porosity are often introduced in the low-k dielectric materials to lower the dielectric constant. Compared with a typical silicon oxide with a dielectric constant of about 4, the low-k dielectric material OSG (Organo-Silicate Glass) has a dielectric constant of about 2.7, and its porous version (Porous OSG) has dielectric constant of about 2.4. Any damage to the low-k material will significantly increase its dielectric constant, and defeat the original purpose of introducing the low-k material. For example, the capacitance value of MOM capacitor 1400 can be measured and compared with reference data to detect or evaluate damage to the low-k dielectric material 1430. For example, an increase in capacitance value may indicate damage to the low-k dielectric material 1430.

Figure 15:
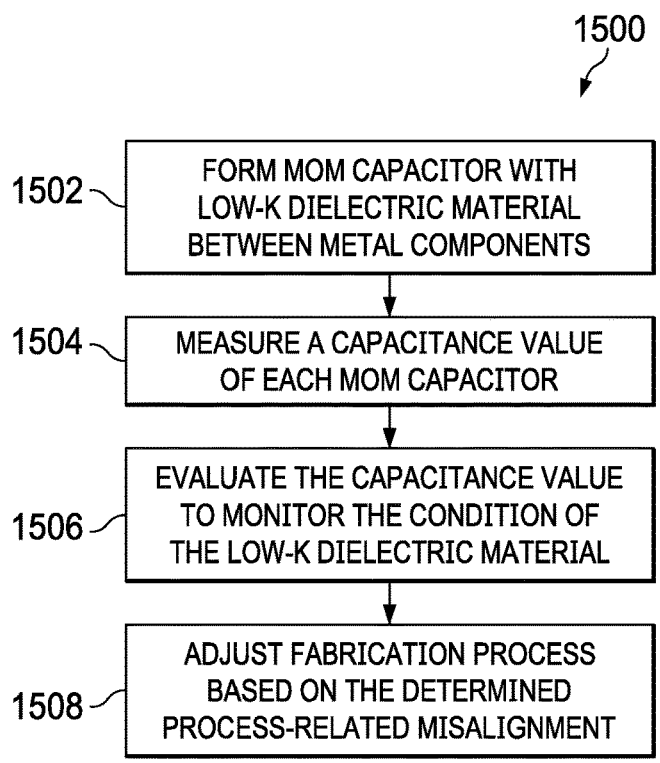
FIG. 15 shows an example method for monitoring low-k dielectric material damage in an IC structure, and taking a corrective action, according to one example embodiment.

FIG. 15 shows an example method 1500 for monitoring low-k dielectric material damage in an IC structure, and taking a corrective action, according to one example embodiment. At 1502, an MOM capacitor is formed, wherein a low-k dielectric material, e.g., organosilicate glass and its porous form, is used as the fill material between metal components, e.g., metal fingers, as discussed above. At 1504, the capacitance value of the MOM capacitor may be measured. At 1506, the capacitance value may be evaluated, e.g., compared against one or more threshold values. For example, determining the capacitance value above a particular threshold value may indicate a significant increase of dielectric constant value in the low-k dielectric material. As 1508, a corrective action may be taken, e.g., discarding devices having damaged low-k dielectric material, or adjusting a fabrication process to reduce the low-k dielectric material damage in subsequently formed devices.

In other embodiments, a MOM capacitor may be used to monitor voids in a gap-fill material formed in an IC device. For IC devices that use aluminum interconnect, dielectric materials (e.g., oxide or fluorosilicate glass (FSG)) are often used to fill the spaces between metal lines in the same metal layer and/or between adjacent metal layers. Such dielectric materials are typically deposited using a High Density Plasma (HDP) oxide deposition process, where an HDP Chemical Vapor Deposition (CVD) process with a multistep dep/etch/dep gap fill is used to fill the gaps between metal lines. In some cases, the deposition process may not completely fill the gap between the metal lines, and leave voids, which may cause yield loss and reliability failure.

Figure 16:
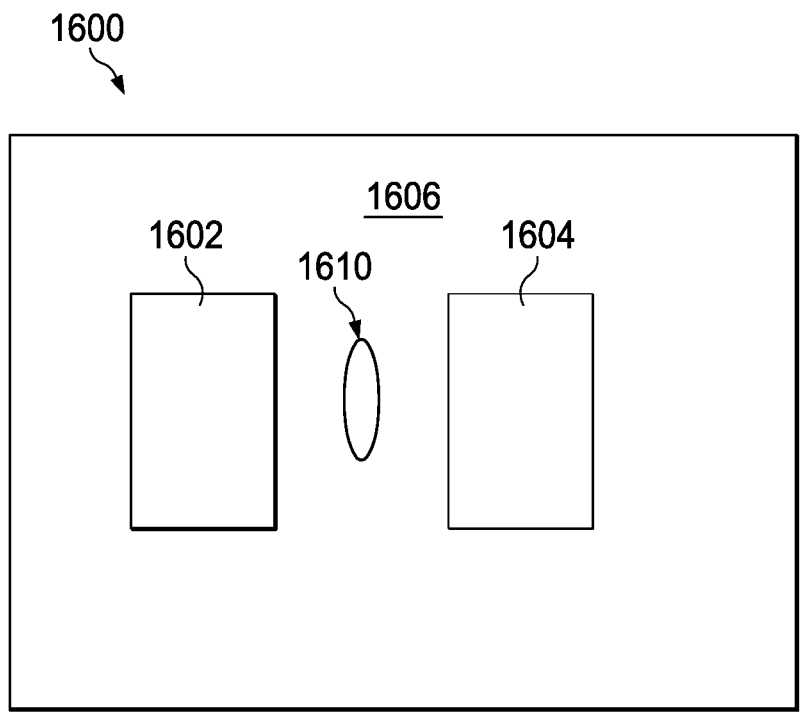
FIG. 16 shows a top view of an example MOM capacitor for monitoring the existence of voids in a dielectric gap-fill material, according to one example embodiment.

FIG. 16 shows a side cross-sectional view of a portion of an example MOM capacitor 1600 for monitoring for voids in a dielectric gap-fill material, according to one example embodiment. In particular, FIG. 16 shows a cross-sectional view of two elongated fingers 1602 and 1604 of the MOM capacitor 1600, with a dielectric material 1606 deposited in the gap between the metal fingers 1602, 1604, e.g., using an HDP deposition process as described above. As shown, a void 1610 may form in the dielectric fill material 1606, e.g., resulting from HDP deposition process.

The existence of voids (e.g., excessive voids) in the dielectric fill material can reduce the capacitance of a MOM capacitor. Thus, in some embodiments, the capacitance of the MOM capacitor 1600 can be monitored over time to electrically detect the existence of voids. Further, as the presence of voids is often intermittent, varying from site to site or wafer to wafer, multiple MOM capacitors 1600 formed at different sites on a wafer, or formed on different wafers, may be tested and compared with each other and/or to reference data (e.g., reference data defining an established distribution) to detect the existence of voids at particular wafer sites or on particular wafers.

Figure 17:
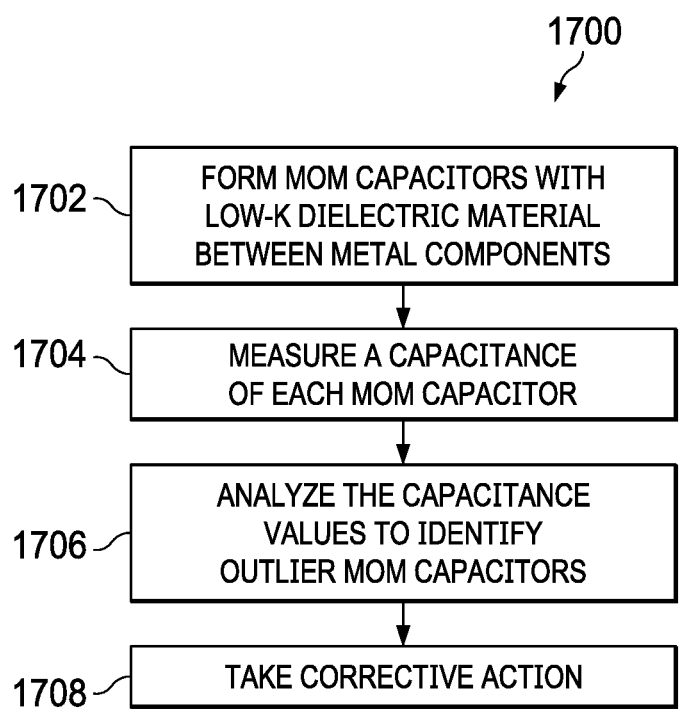
FIG. 17 shows an example method for monitoring for dielectric material voids in an IC structure, and taking a corrective action, according to one example embodiment.

FIG. 17 shows an example method 1700 for monitoring for voids in a dielectric gap-fill material in an IC structure, and taking a corrective action, according to one example embodiment. At 1702, multiple MOM capacitors are formed, each including metal components (e.g., fingers) spaced apart by dielectric regions. At 1704, a capacitance of each MOM capacitor is measured. At 1706, a distribution of the measured capacitances is analyzed and comparing with a normal or Gaussian distribution to identify MOM capacitors having an outlier capacitance, which may indicate the existence of dielectric region voids in the identified outlier MOM capacitors. As 1708, a corrective action may be taken, e.g., discarding devices or structures including the outlier MOM capacitors, or adjusting a fabrication process to reduce the formation of voids in the dielectric material.

In other embodiments, a MOM capacitor may be used to monitor aluminum corrosion in an IC device. Under certain stress conditions (e.g., moisture in the environment, or voltage or current in the metal lines), the corrosion in the aluminum will accelerate, and a MOM capacitor can be used as early warning structure for corrosion detection.

Figure 18:
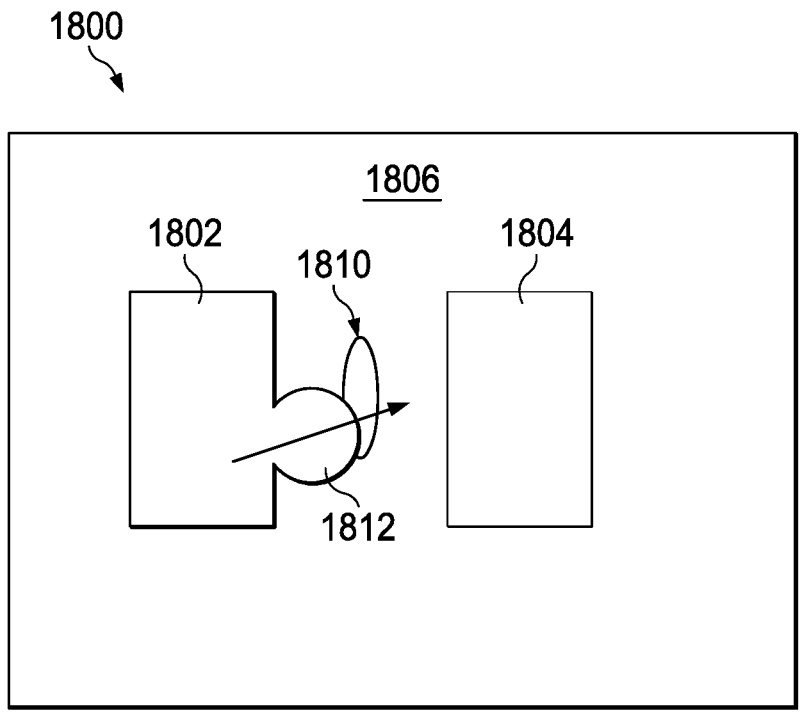
FIG. 18 shows a top view of an example MOM capacitor for monitoring aluminum corrosion, according to one example embodiment.

FIG. 18 shows a side cross-sectional view of a portion of an example MOM capacitor 1800 for monitoring aluminum corrosion, according to one example embodiment. In particular, FIG. 18 shows a cross-sectional view of elongated fingers 1802 and 1804 of the MOM capacitor 1800, each formed of aluminum, with a dielectric material 1806 deposited in the gap between the elongated fingers 1802, 1804, e.g., using an HDP deposition process as described above. As shown, voids 1810 may form in the dielectric fill material 1806, e.g., resulting from a defective HDP deposition process. As noted above, under certain stress conditions (e.g., moisture in the environment, or voltage or current through aluminum fingers 1802 and/or 1804), elongated fingers 1802 and/or 1804 may experience micro-corrosion growth into voids 1810, as indicated at 1812. In some embodiments, the capacitance and breakdown voltage of the MOM capacitor 1800 can be monitored over time, to detect such aluminum corrosion in the MOM capacitor 1800.

Figure 19:
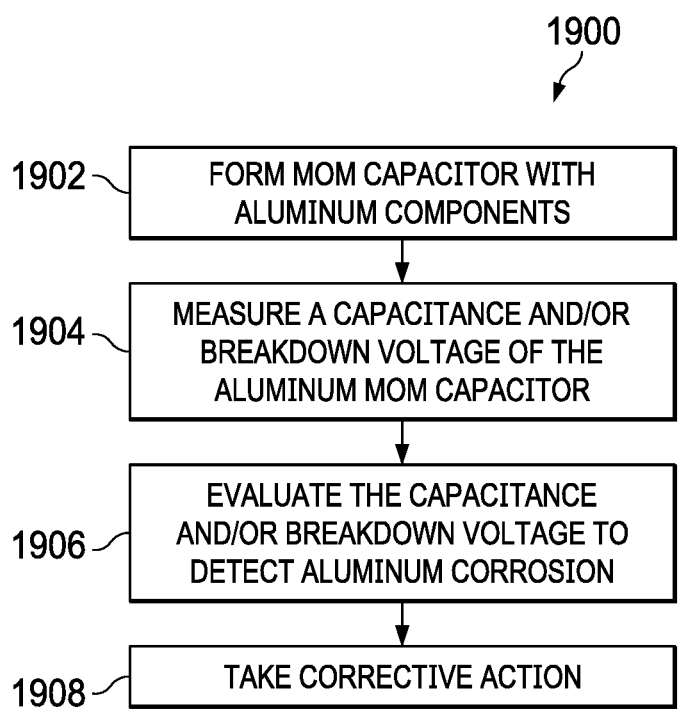
FIG. 19 shows an example method for monitoring aluminum corrosion in an IC structure, according to one example embodiment and taking a corrective action, according to one example embodiment.

FIG. 19 shows an example method 1900 for monitoring aluminum corrosion in an IC structure, according to one example embodiment and taking a corrective action, according to one example embodiment. At 1902, an MOM capacitor is formed, including aluminum components (e.g., fingers) spaced apart by dielectric regions. At 1904, a capacitance and breakdown voltage of the MOM capacitor are measured over time. At 1906, a change in the capacitance and/or breakdown voltage is detected over time (e.g., a change exceeding a threshold value), and aluminum corrosion is identified in the IC structure based on the identified change in the capacitance value and/or breakdown voltage of the MOM capacitor. As 1908, a corrective action may be taken, e.g., discarding devices or structures including the aluminum corrosion, or adjusting a process to reduce the development of aluminum corrosion.

In other embodiments, a MOM capacitor may be used to monitor copper interconnect reliability in an IC device. In copper interconnect, the interface between the copper and a dielectric barrier layer (e.g., SiC or SiN) deposited after copper CMP may be very important, as most reliability failures may originate from this interface. For example, voids or residue in the interface may lead to an open circuit or electrical short circuit under certain stress conditions. In some embodiments, a MOM capacitor under stress, either inline or at end of line, can be measured to monitor the copper/dielectric barrier interface. In one embodiment, a large number of MOM capacitors may be formed and tested to generate statistical data for reliability evaluation.

Figure 20:
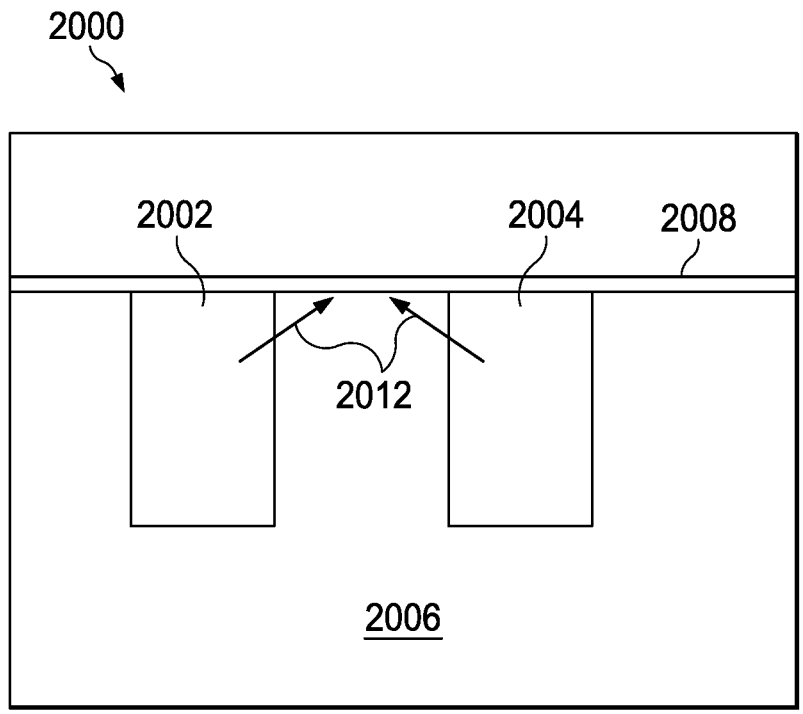
FIG. 20 shows a side cross-sectional view of a portion of an example MOM capacitor for monitoring copper corrosion, according to one example embodiment.

FIG. 20 shows a side cross-sectional view of a portion of an example MOM capacitor 2000 for monitoring the quality or reliability of copper interconnect by monitoring an interface between copper structures and a dielectric barrier layer, according to one example embodiment. In particular, FIG. 20 shows a cross-sectional view of elongated copper fingers 2002 and 2004 of the MOM capacitor 2000, with a dielectric material 2006 in the space between the elongated copper fingers 2002, 2004. A dielectric barrier layer 2008 (e.g., SiC or SiN) is deposited on the elongated copper fingers 2002 and 2004 after a copper CMP process. Potential residue sites are indicated by arrows 2012, which may from an undesired connection (metal shorting) between the two copper fingers 2002 and 2004 under electric current stress. In some embodiments, the breakdown voltage of the MOM capacitor 2000, or an array of MOM capacitors 2000, can be monitored to evaluate the copper/dielectric barrier interface.

Figure 21:
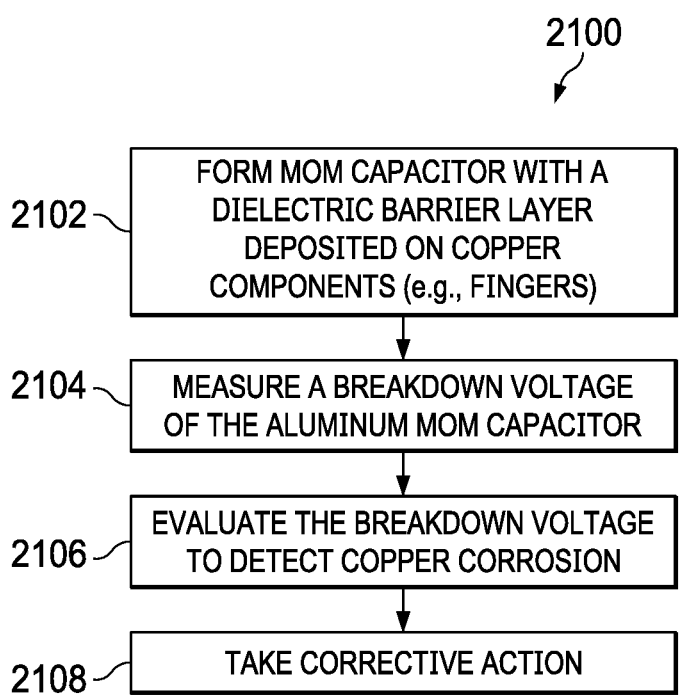
FIG. 21 shows an example method for monitoring copper corrosion in an IC structure, and taking a corrective action, according to one example embodiment.

FIG. 21 shows an example method 2100 for monitoring copper interconnect reliability in an IC structure, and taking a corrective action, according to one example embodiment. At 2102, an MOM capacitor is formed, including a dielectric barrier layer (e.g., (e.g., SiC or SiN) deposited on copper components (e.g., fingers) to define a copper/dielectric barrier layer interface. At 2104, the breakdown voltage of the MOM capacitor is measured over time. At 2106, a change in the breakdown voltage over time is detected (e.g., a change exceeding a threshold value), and copper interconnect reliability concern is identified based on the identified change in the breakdown voltage. As 2108, a corrective action may be taken, e.g., discarding devices or structures including the copper reliability concern, or adjusting a process to address the reliability concern.

The invention claimed is:

1. A method of evaluating an integrated circuit structure, the method comprising:
   forming a plurality of metal-oxide-metal (MOM) capacitors in a plurality of patterned layers of the integrated circuit structure;
   wherein each of the plurality of MOM capacitors is formed with a different alignment between the patterned layers in at least one direction;
   performing electrical testing of the plurality of MOM capacitors; and
   determining a patterned layer misalignment in the plurality of patterned layers based on the electrical testing.

2. The method of claim 1, wherein determining the patterned layer misalignment comprises determining a process-related misalignment associated with forming the plurality of patterned layers.

3. The method of claim 1, wherein determining the patterned layer misalignment comprises determining the process-related misalignment in two orthogonal directions.

4. The method of claim 1, wherein the plurality of MOM capacitors are formed with different programmed layer alignments relative to a target alignment in two orthogonal directions.

5. The method of claim 1, further comprising initiating a corrective action in response to the determined patterned layer misalignment.

6. The method of claim 5, wherein the corrective action comprises adjusting a process for forming at least one of the patterned layers based on the determined patterned layer misalignment.

7. The method of claim 1, wherein forming the plurality of MOM capacitors in the plurality of patterned layers of the integrated circuit structure comprises:
   forming a first metal layer and a second metal layer, each of the first and second metal layers including comb-like components including a plurality of elongated fingers; and
   forming a via layer between the first and second metal layers, the via layer including at least one via connecting at least one elongated finger formed in the first metal layer with at least one elongated finger formed in the second metal layer.

8. The method of claim 1, wherein performing electrical testing on the plurality of MOM capacitors comprises:
   determining a breakdown voltage of each MOM capacitor; and
   identifying a MOM capacitor of the plurality of MOM capacitors having a highest breakdown voltage.

9. The method of claim 1, wherein determining a patterned layer misalignment based on the electrical testing comprises:
   identifying a best-aligned MOM capacitor from the plurality of MOM capacitors based on the electrical testing of the plurality of MOM capacitors; and
   determining the patterned layer misalignment based on the identified best-aligned MOM capacitor.

10. The method of claim 1, wherein:
   forming the plurality of MOM capacitors comprises:
      defining a different programmed layer alignment relative to a target alignment for each of the plurality of MOM capacitors; and
      forming the plurality of MOM capacitors, each formed MOM capacitor having an actual layer alignment; and
   determining the patterned layer misalignment in the plurality of patterned layers based on the electrical testing comprises:
      based on the electrical testing of the plurality of MOM capacitors, identifying a MOM capacitor of the plurality of MOM capacitors having an actual layer alignment closest to the target alignment; and determining at least one of a direction and a magnitude of a process-related misalignment based on the programmed layer alignment of the identified MOM capacitor having the actual layer alignment closest to the target alignment.

11. The method of claim 1, wherein forming the plurality of MOM capacitors with a different alignment between the patterned layers in at least one direction comprises:
forming a first MOM capacitor including first MOM capacitor first elements formed in a first patterned layer and first MOM capacitor second elements formed in a second patterned layer, wherein respective first MOM capacitor second elements are formed with a first lateral alignment relative to corresponding first MOM capacitor first elements; and
forming a second MOM capacitor including second MOM capacitor first elements formed in the first patterned layer and second MOM capacitor second elements formed in the second patterned layer, wherein respective second MOM capacitor second elements are formed with a second lateral alignment relative to corresponding second MOM capacitor first elements, wherein the second lateral alignment is different than the first lateral alignment.

12. The method of claim 11, wherein:
the first MOM capacitor first elements comprise a plurality of first elongated fingers of a first comb-like structure formed in a first metal layer;
the first MOM capacitor second elements comprise a plurality of first vias formed in a via layer, respective ones of the plurality of first vias connected to respective ones of the plurality of first elongated fingers of the first comb-like structure;
wherein respective first vias are formed with the first lateral alignment relative to corresponding first elongated fingers;
the second MOM capacitor first elements comprise a plurality of second elongated fingers of a second comb-like structure formed in the first metal layer;
the second MOM capacitor second elements comprise a plurality of second vias formed in the via layer, respective ones of the plurality of second vias connected to respective ones of the plurality of second elongated fingers of the second comb-like structure;
wherein respective second vias are formed with the second lateral alignment relative to corresponding second elongated fingers.

13. A metal-oxide-metal (MOM) capacitor array, comprising:
a first MOM capacitor structure and a second MOM capacitor structure formed in a common plurality of patterned layers of an integrated circuit structure, the common plurality of patterned layers including a first metal layer, a second metal layer, and a via layer between the first metal layer and the second metal layer;
the first MOM capacitor structure comprising:
a plurality of first MOM capacitor first elongated fingers formed in the first metal layer;
a plurality of first MOM capacitor second elongated fingers formed in the second metal layer; and
a plurality of first MOM capacitor vias formed in the via layer, wherein respective first MOM capacitor vias connect respective first MOM capacitor first elongated fingers with respective first MOM capacitor second elongated fingers; and
the second MOM capacitor structure separate from the first MOM capacitor structure and comprising:
a plurality of second MOM capacitor first elongated fingers formed in the first metal layer;
a plurality of second MOM capacitor second elongated fingers formed in the second metal layer; and
a plurality of second MOM capacitor vias formed in the via layer, wherein respective second MOM capacitor vias connect respective second MOM capacitor first elongated fingers with respective second MOM capacitor second elongated fingers;
wherein a lateral alignment of the first MOM capacitor vias formed in the via layer relative to respective first MOM capacitor first elongated fingers formed in the first metal layer is different than a lateral alignment of the second MOM capacitor vias formed in the via layer relative to respective second MOM capacitor first elongated fingers formed in the first metal layer.

14. The MOM capacitor array of claim 13, wherein a lateral alignment of the first MOM capacitor vias formed in the via layer relative to respective first MOM capacitor second elongated fingers formed in the second metal layer is different than a lateral alignment of the second MOM capacitor vias formed in the via layer relative to respective second MOM capacitor second elongated fingers formed in the second metal layer.

* * * * *